US010355165B2

(12) United States Patent
Mann et al.

(10) Patent No.: US 10,355,165 B2
(45) Date of Patent: Jul. 16, 2019

(54) BURIED ACTIVATED P-(AL,IN)GAN LAYERS

(71) Applicant: Gallium Enterprises Pty Ltd, Silverwater (AU)

(72) Inventors: Ian Mann, Curl Curl (AU); Satyanarayan Barik, Holroyd (AU); Joshua David Brown, Umina Beach (AU); Danyu Liu, Newington (AU)

(73) Assignee: Gallium Enterprises Pty Ltd, Silverwater (AU)

( * ) Notice: Subject to any disclaimer, the term of this patent is extended or adjusted under 35 U.S.C. 154(b) by 0 days.

(21) Appl. No.: 16/182,393

(22) Filed: Nov. 6, 2018

(65) Prior Publication Data
US 2019/0140134 A1 May 9, 2019

(30) Foreign Application Priority Data

Nov. 7, 2017 (AU) ................................ 2017904517

(51) Int. Cl.
*H01L 33/02* (2010.01)
*H01L 33/06* (2010.01)
*H01L 33/00* (2010.01)
*H01L 33/32* (2010.01)

(52) U.S. Cl.
CPC .......... *H01L 33/007* (2013.01); *H01L 33/025* (2013.01); *H01L 33/06* (2013.01); *H01L 33/325* (2013.01)

(58) Field of Classification Search
CPC ..... H01L 33/007; H01L 33/025; H01L 33/06; H01L 33/325
See application file for complete search history.

(56) References Cited

U.S. PATENT DOCUMENTS

| 5,888,886 A | 3/1999 | Sverdlov et al. |
| 9,029,867 B2 | 5/2015 | Walukiewicz et al. |
| 9,312,430 B2 | 4/2016 | Walukiewicz et al. |
| 2010/0047976 A1 | 2/2010 | Otake et al. |
| 2011/0204376 A1* | 8/2011 | Su ....................... H01L 25/0756 257/76 |
| 2012/0153254 A1 | 6/2012 | Mastro |
| 2012/0258580 A1* | 10/2012 | Brown ................ H01L 21/0237 438/478 |

(Continued)

FOREIGN PATENT DOCUMENTS

WO 2014/008557 A1 1/2014
WO 2015/106318 A1 7/2015

(Continued)

OTHER PUBLICATIONS

Akyol, F. et al., "Low-resistance GaN tunnel homojunctions with 150 kA/cm2 current and repeatable negative differential resistance," Applied Physics Letters, 2016, vol. 108, 131103, 12 pages.

(Continued)

*Primary Examiner* — Joseph M Galvin, III

(57) ABSTRACT

Methods for fabricating semiconductor devices incorporating an activated p-(Al,In)GaN layer include exposing a p-(Al,In)GaN layer to a gaseous composition of $H_2$ and/or $NH_3$ under conditions that would otherwise passivate the p-(Al,In)GaN layer. The methods do not include subjecting the p-(Al,In)GaN layer to a separate activation step in a low hydrogen or hydrogen-free environment. The methods can be used to fabricate buried activated n/p-(Al,In)GaN tunnel junctions, which can be incorporated into electronic devices.

29 Claims, 20 Drawing Sheets

(56) References Cited

U.S. PATENT DOCUMENTS

| | | |
|---|---|---|
| 2012/0315741 A1* | 12/2012 | Su .................. H01L 21/0237 438/478 |
| 2013/0016752 A1 | 1/2013 | Lell et al. |
| 2013/0026484 A1 | 1/2013 | Walukiewicz et al. |
| 2015/0167162 A1 | 6/2015 | Bank et al. |
| 2016/0005909 A1 | 1/2016 | Newman |
| 2017/0323803 A1 | 11/2017 | Van Schravendijk et al. |
| 2017/0338369 A1* | 11/2017 | Wildeson ............. H01L 33/02 |
| 2017/0338373 A1 | 11/2017 | Wildeson et al. |

FOREIGN PATENT DOCUMENTS

| | | |
|---|---|---|
| WO | 2017/011387 A1 | 1/2017 |
| WO | 2014/201363 A1 | 11/2017 |

OTHER PUBLICATIONS

Hu, W. et al., "A low resistivity n++-InGaN/p++-Gan polarized-induced tunnel junction," Journal of Physics D: Applied Physics, 2016, vol. 49, 115103, 5 pages.

Jeon, Seong-Ran et al., "GaN-Based Light-Emitting Diodes Using Tunnel Junctions," IEEE Journal of Selected Topics in Quantum Electronics, Jul./Aug. 2002, vol. 8 No. 4, p. 739-743.

Kaga, M. et al., "GaInN-Based Tunnel Junctions in n-p-n Light Emitting Diodes," Japanese Journal of Applied Physics, 2013, vol. 52, 08JH06, 4 pages.

Krishnamoorthy, S. et al., "Low Resistance GaN/InGaN/GaN Tunnel Junctions," Applied Physics Letters, 2013, vol. 102, 113503, 14 pages.

Kuwano, Y. et al., "Lateral Hydrogen Diffusion at p-GaN Layers in Nitride-Based Light Emitting with Tunnel Junctions," Japanese Journal of Applied Physics, 2013, vol. 52, 08JK12-1, 3 pages.

Piprek, J. et al "Origin of InGaN/GaN light-emitting diode efficiency improvements using tunnel-junction-cascaded active regions," Applied Physics Letters, 2014, vol. 104, 051118, 4 pages.

Young, E.C. et al., "Hybrid tunnel junction contacts to III-nitride light-emitting diodes," Applied Physics Express, 2016, vol. 9, 022102, 4 pages.

* cited by examiner

Table 4. Tunnel junction treatment conditions and LED performance.

| Test | Pre-Growth Treatment | Pre-growth cleaning conditions | | | | | EL at 10 A/cm$^2$ | | | |
|---|---|---|---|---|---|---|---|---|---|---|
| | | Temp. (°C) | Pressure (Torr) | NH$_3$ flow (sccm) | N$_2$ flow (sccm) | H$_2$ flow (sccm) | LOP (mW) | V$_f$ (V) | ΔV$_f$ (V) Ref. A | ΔV$_f$ (V) Ref. B |
| Reference A Full blue LED with ITO | -- | -- | -- | -- | -- | -- | 67.1 | 6.01 | -- | -0.18 |
| Reference B Partial blue LED with ITO | -- | -- | -- | -- | -- | -- | 50.8 | 6.28 | 0.18 | -- |
| Process Conditions A TJ on treated Reference A | NH$_3$:N$_2$ | 940 | 100 | 8,000 | 10,000 | -- | 70.6 | 8.52 | 2.51 | 2.24 |
| Process Conditions B TJ on treated Reference B | NH$_3$:H$_2$ | 940 | 100 | 8,000 | -- | 20,000 | 68.3 | 6.01 | 0.00 | -0.27 |
| Process Conditions C TJ on treated Reference B | N$_2$ | 905 | 100 | -- | 14,500 | -- | 75.8 | 8.01 | 2.00 | 1.73 |

FIG. 17

BURIED ACTIVATED P-(AL,IN)GAN LAYERS

This application claims the benefit under 35 U.S.C § 119(e) of Australian Provisional Application No. 2017904517 filed on Nov. 7, 2017, which is incorporated by reference in its entirety.

FIELD

The disclosure relates to methods for growing semiconductor devices incorporating an activated p-(Al,In)GaN layer that include exposing a p-(Al,In)GaN layer to a gaseous composition if $H_2$ and/or $NH_3$ to provide a semiconductor structure having an activated p-(Al,In)GaN layer without using a separate activation step in a low hydrogen or hydrogen-free environment. The methods can be used to fabricate buried activated n/p-(Al,In)GaN tunnel junctions, which can be incorporated into electronic devices.

BACKGROUND

MOCVD-grown p-(Al,In)GaN forms Mg—H complexes that reduce the number of free holes available for conduction and thereby increase the resistivity of the p-(Al,In)GaN layer. The introduction of hydrogen into the p-(Al,In)GaN layer is unavoidable during MOCVD growth because even if the deposition carrier gas does not include $H_2$, the dissociation of $NH_3$ provides sufficient $H_2$ for Mg—H complexes to form.

After the passivated p-(Al,In)GaN layer is formed, Mg—H complexes can be removed by thermally annealing the p-(Al,In)GaN layer in a $H_2$-free environment such as in an $N_2$ and/or $O_2$ environment. The annealing process breaks Mg—H bonds, removes $H_2$ from the p-(Al,In)GaN layer and results in a decreased resistivity. The process of conditioning a passivated p-(Al,In)GaN layer to decrease the resistivity is referred to as activating the p-(Al,In)GaN layer, and the resulting p-(Al,In)GaN layer is referred to as an activated p-(Al,In)GaN layer.

Re-exposing an activated p-(Al,In)GaN layer to a $H_2$ and $NH_3$ environment can cause Mg—H complexes to re-form and thus re-passivate the p-(Al,In)GaN layer.

In general, it is not possible to activate a passivated p-(Al,In)GaN layer after an overlying semiconductor layer such as an n-(Al,In)GaN layer has been deposited on the passivated p-(Al,In)GaN layer. Because $H_2$ cannot diffuse vertically through an overlying n-(Al,In)GaN layer, the buried p-(Al,In)GaN layer cannot be thermally activated when annealed at high temperatures in a $H_2$-free environment.

To activate a buried passivated p-(Al,In)GaN layer, trenches can be etched into the semiconductor structure to expose the edges of the buried p-(Al,In)GaN layer to enhance the ability of $H_2$ to laterally diffuse and escape from the sidewalls of the trench during an annealing step.

Alternatively, activated p-(Al,In)GaN layers can be directly grown using certain semiconductor growth methods in which $H_2$ is not present during the growth process. For example, molecular beam epitaxy (MBE) in which the $H_2$ partial pressure is low, can be used to grow high-quality activated p-(Al,In)GaN layers. However, an activated p-(Al,In)GaN layer can become passivated when exposed to $H_2$ at high temperature, for example, when semiconductor layers are grown over the activated p-(Al,In)GaN layer at higher growth pressure. This can occur, for example, when an activated p-(Al,In)GaN layer is part of a semiconductor device and subsequently deposited semiconductor layers are grown using MOCVD, which employs $H_2$ and/or $NH_3$ as a carrier gas. For these reasons, it has not been possible to grow a semiconductor structure incorporating a buried activated p-(Al,In)GaN layer where the semiconductor layers immediately above the p-(Al,In)GaN layer are grown using metal organic chemical vapor deposition (MOCVD).

Although this can be achieved using RFMBE. and possibly $NH_3$ molecular beam epitaxy (MBE), using these growth methods is undesirable due to the complexities of ultra-high vacuum (UHV) and the difficulty in scaling.

Because semiconductors can be grown in a $H_2$-free environment using RPCVD it should, in principle, be possible to overgrow an activated p-(Al,In)GaN layer using RPCVD without passivating the underlying activated p-(Al,In)GaN layer. However, it has been demonstrated that semiconductor layers grown in a predominantly $H_2$-free environment using RPCVD including p-(Al,In)GaN and n-(Al,In)GaN layers exhibit inferior quality compared to those grown in the presence of $H_2$ and $NH_3$, and consequently viable devices cannot be readily grown using RPCVD without using $H_2$ and $NH_3$. It has also been shown that the levels of $H_2$ and $NH_3$ required during the growth of semiconductor layers by RPCVD to achieve high-quality layers are sufficient to passivate a previously activated p-(Al,In)GaN layer.

Therefore, although semiconductor layers overlying an activated p-(Al,In)GaN layer can be grown in a $H_2$-free environment such as by using RPCVD and can be expected to retain the activation state of the p-(Al,In)GaN layer, the reduced quality of the overlying semiconductor layers due to the growth conditions will negatively affect device performance. In contrast, the quality of the overlying layers can be improved through the use of sufficient amounts $H_2$ and $NH_3$ during the RPCVD growth. However the levels of $H_2$ and $NH_3$ that are required to achieve the highest quality would then be expected to passivate any underlying p-(Al,In)GaN layers. It would therefore be expected that for any device comprising a buried p-(Al,In)GaN layer with overlying layers grown using an optimized RPCVD process, the buried p-(Al,In)GaN will not be fully activated.

It is desirable to have a semiconductor growth process in which semiconductor layers can be grown overlying an activated p-(Al,In)GaN layer in a high $H_2$ environment such as using MOCVD without passivating the underlying p-(Al,In)GaN layer and without having to undertake post-fabrication steps to re-activate the buried passivated p-(Al,In)GaN layer.

SUMMARY

According to the present invention, methods of fabricating a semiconductor structure comprise a buried activated p-(Al,In)GaN layer, comprising: (a) exposing a magnesium-doped p-(Al,In)GaN layer to a gaseous mixture comprising $H_2$, $NH_3$, or a combination thereof, wherein the gaseous mixture has a partial pressure of $H_2$ is less than 760 Torr, to provide an exposed magnesium-doped p-(Al,In)GaN layer; and (b) growing an n-(Al,In)GaN layer on the exposed magnesium-doped p-(Al,In)GaN layer in an environment comprising $H_2$, $NH_3$, or a combination thereof, to provide a semiconductor structure comprising a buried activated p-(Al,In)GaN layer.

According to the present invention, semiconductor devices comprise a semiconductor structure fabricated by methods according to the present invention.

According to the present invention, n/p-(Al,In)GaN tunnel junctions comprise a semiconductor structure fabricated by methods according to the present invention.

According to the present invention, semiconductor devices comprise the tunnel junction according to the present invention.

BRIEF DESCRIPTION OF THE DRAWINGS

The drawings described herein are for illustration purposes only. The drawings are not intended to limit the scope of the present disclosure.

FIG. 17 is a table (Table 4) showing various tunnel junction treatment conditions and corresponding device properties.

DETAILED DESCRIPTION

Figure 1:
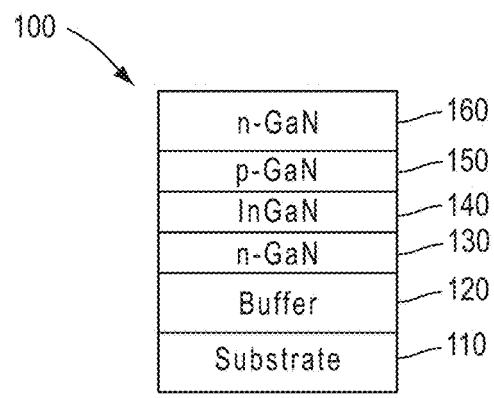
FIG. 1 is a schematic representation of the layers forming a simple semiconductor structure, such as a light emitting diode (LED).

For purposes of the following detailed description, it is to be understood that embodiments provided by the present disclosure may assume various alternative variations and step sequences, except where expressly specified to the contrary. Moreover, other than in any operating examples, or where otherwise indicated, all numbers expressing, for example, quantities of ingredients used in the specification and claims are to be understood as being modified in all instances by the term "about." Accordingly, unless indicated to the contrary, the numerical parameters set forth in the following specification and attached claims are approximations that may vary depending upon the desired properties to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard variation found in their respective testing measurements.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

Reference is now made to certain methods and semiconductor devices. The disclosed methods and semiconductor devices are not intended to be limiting of the claims. To the contrary, the claims are intended to cover all alternatives, modifications, and equivalents.

Semiconductor structures including metal or metalloid-containing films, such as gallium nitride (GaN) films, have applications in a range of devices from light emitting diodes (LEDs) to ultraviolet detectors to transistor devices. These films have commonly been produced by techniques including molecular beam epitaxy (MBE), metal organic chemical vapor deposition (MOCVD) and remote plasma-enhanced chemical vapor deposition (RPECVD or RPCVD).

MOCVD is a widely used process for the production of high-quality LEDs and the like, but MOCVD relies on high temperatures and the use of significant amounts of $NH_3$. While this may not be particularly problematic for the growth of, for example, n-type GaN, it can create challenges when growing p-type layers, such as p-GaN, because the hydrogen present due to the pyrolysis of the $NH_3$ forms complexes with the acceptor dopants reducing the free carrier concentration and increasing the resistivity of the layer.

FIG. 1 shows a basic example of such a device, for example an LED 100. The LED 100 comprises a substrate layer 110 which may be sapphire or other commonly used substrate material. There may be a buffer layer 120, grown on the substrate layer 110, to assist with achieving structural quality in the device by reducing defects in the epitaxial growth in moving away from the substrate layer 110. The buffer layer 120 may, for example, be formed from GaN although AlGaN or other semiconductor material as appropriate, depending on the nature of the layers to be overgrown.

On top of the buffer layer 120 is an n-GaN layer 130 which may have been doped with silicon, for example. The n-GaN layer 130 would typically be grown under high temperature conditions using MOCVD.

The device 100 next has an active layer 140 formed by one or more InGaN layers. Active layer 140 may comprise a quantum well (QW) or may form a multiple quantum well (MQW) structure and is responsible for light generation.

In the example shown in FIG. 1, the next layer is a p-GaN layer 150. To achieve a p-type layer requires doping with an acceptor atom, such as magnesium. During growth of such a p-type layer 150, using MOCVD, the epitaxial p-type layers will have hydrogen present within the structure due to the pyrolysis of the $NH_3$ and also the presence of $H_2$ typically used in the MOCVD process. Upon cooling of the device this hydrogen is known to bind to and passivate the magnesium atoms in the p-type layer. This prevents the magnesium atoms from acting as effective acceptor atoms and results in a highly resistive layer.

Various solutions have been proposed to deal with this issue, including thermal annealing, but while it is possible to at least temporarily re-activate the p-GaN layer the p-GaN will once again become passivated upon cooling, unless the environment can be kept hydrogen-free.

A particular challenge is created when a further semiconductor layer is grown on top of this p-type layer, such as an n-type layer, as shown in FIG. 1 as n-GaN layer 160. When this layer is grown under MOCVD conditions, the p-GaN layer has a hydrogen content. Once the n-GaN layer 160 is complete and the device is cooled, this already present hydrogen will form a complex with the magnesium acceptor atoms, as discussed. The additional problem now is that the n-GaN layer 160 serves to effectively trap any hydrogen within the p-GaN layer 150 and therefore, even if the device is cooled under a hydrogen-free environment, the already trapped hydrogen cannot escape. While a subsequent high temperature treatment may dissociate the Mg—H complexes temporarily, because the hydrogen cannot escape vertically from the buried p-GaN layer 150, the complexes will always reform upon cooling and therefore the device is inherently limited by the high resistivity of this buried p-GaN layer 150.

One solution to this problem is proposed in U.S. Pat. No. 6,537,838 which suggests etching of the upper n-type layer. This results in a trench exposing sides of the p-type layer to the environment. This allows for the use of a subsequent annealing step to facilitate hydrogen migration out of the exposed sides of the p-type GaN layer. While this may achieve a local activation of the buried p-GaN layer between the trenches, it clearly does not solve the problem of protecting the buried p-GaN layer from further exposure to a hydrogen environment, which would allow hydrogen to enter the exposed sides of the p-type GaN layer. Therefore, precautions must be taken if such a structure is exposed to additional MOCVD growth conditions. It is also something of a compromise in that, while the resistivity of the p-type GaN layer may be lowered, a portion of the p-type GaN layer and the overgrown n-type layer need to be removed to fabricate the trench.

It is therefore desirable to provide an approach which allows for buried p-type GaN layers to be overgrown, particularly with immediately adjacent or subsequent n-type layers in a $H_2$ or $NH_3$ and $H_2$ environment, while in a substantially activated state.

In a first aspect, although it need not be the only or indeed the broadest form, the invention resides in a method for the growth of an n-type Group III nitride semiconductor layer over a p-type Group III nitride semiconductor layer, wherein the p-type Group III nitride semiconductor layer has been grown in a hydrogen environment, including the steps of: exposing the p-type Group III nitride semiconductor layer to a Group V plasma, a Group III reagent and an n-type dopant reagent; and allowing the n-type Group III nitride semiconductor layer to grow at a pressure of between 0.1 to 760 Torr to thereby grow an n-type Group III nitride semiconductor layer over a p-type Group III nitride semiconductor layer.

In embodiments, the p-type Group III nitride semiconductor layer grown in the hydrogen environment can be at least partially grown under MOCVD conditions. MOCVD, as previously discussed, involves growth in a hydrogen-rich environment and so results in hydrogen incorporation into the as-grown p-type layer. The p-type Group III nitride semiconductor layer can be grown in an atmosphere of $NH_3$ and/or a mixture of $NH_3$ and $H_2$.

In embodiments wherein the p-type Group III nitride semiconductor layer comprises more than one individual p-type Group III nitride semiconductor layer, then at least one of those layers can be grown under MOCVD conditions. The majority of individual p-type Group III nitride semiconductor layers can be grown under MOCVD conditions. Substantially all of the individual p-type Group III nitride semiconductor layers can be grown under MOCVD conditions.

Alternatively, the p-type Group III nitride semiconductor layer grown in the hydrogen environment can be at least partially grown under RPCVD conditions.

In one embodiment, the method may further include the step of growing one or more additional semiconductor layers between the p-type Group III nitride semiconductor layer grown in the hydrogen environment and the n-type Group III nitride semiconductor layer grown over it. That is, the n-type Group III nitride semiconductor is not in direct abutment with or grown directly onto the surface of the p-type Group III nitride semiconductor layer grown in the hydrogen environment.

Each of the one or more additional semiconductor layers may independently be undoped, doped n-type, highly doped n-type, doped p-type or highly doped p-type semiconductor layers. In one embodiment, and as indicated above, an additional p-type Group III nitride semiconductor layer may be grown directly onto the p-type Group III nitride semiconductor layer or may be considered to be a continuation of that layer.

In embodiments, one or more of the additional semiconductor layers may form an active region. The active region may comprise a quantum well (QW) or multiple quantum wells (MQWs).

The Group III element of the p-type and n-type Group III nitride semiconductor layers, and any additional semiconductor layers, may be independently selected from one or more of gallium, indium and aluminum. The active region may be formed from semiconductor materials known to be useful as active regions for light generation, such as InGaN and InAlGaN.

In one embodiment, the p-type Group III nitride semiconductor layer is p-GaN.

In another embodiment, the n-type Group III nitride semiconductor layer is n-GaN.

In embodiments, the Group V plasma is a nitrogen plasma.

Suitably, the Group III reagent is a Group III metal organic reagent.

The Group III metal organic reagent can be a Group III metal alkyl reagent.

The Group III metal alkyl reagent can be selected from the group consisting of trimethylgallium, triethylgallium, trimethylindium and trimethylaluminum.

In certain embodiments, the n-type dopant of any n-type layer within the semiconductor structure formed by the method of the first aspect comprises one or more of silicon, germanium or oxygen. Suitable reagents that contain certain of these elements include silane, disilane, di-tert-butylsilane and molecular oxygen. The n-type dopant can be silicon.

In embodiments, the p-type dopant of any p-type layer within the semiconductor structure formed by the method comprises one or more of magnesium or zinc. Suitable reagents that contain these elements, such as diethyl zinc (DEZn) and bis(cyclopentadienyl)magnesium ($Cp_2Mg$), can be selected from those known in the art for p-type doping. The p-type dopant can be magnesium.

In certain embodiments, the n-type Group III nitride semiconductor layer may be grown immediately on top of and in contact with the p-type Group III nitride semiconductor layer which is grown in the hydrogen-rich environment.

In embodiments, the method may result in the formation of a tunnel junction. The tunnel junction may simply be formed by the n-type Group III nitride semiconductor layer and p-type Group III nitride semiconductor layer interface or each of these layers may itself be formed from two or more individual layers and one or more of these layers may be a highly doped semiconductor layer. That is, in one embodiment, the junction of the n-type Group III nitride semiconductor layer and p-type Group III nitride semiconductor layer may be an interaction between a highly doped n-type Group III nitride semiconductor layer and a highly doped p-type Group III nitride semiconductor layer. Any of the highly doped p-type or n-type layers described herein may be defined as having atomic dopant concentrations greater than $5E19/cm^3$.

The exposing of the p-type Group III nitride semiconductor layer to the Group V plasma, Group III reagent and n-type dopant reagent is an exposure to RPCVD growth conditions. That is, the p-type Group III nitride semiconductor layer is exposed to a Group V plasma which is provided by a remote plasma source. Such plasma sources are well known in the art.

Suitably, the RPCVD conditions for overgrowth of the n-type layer can include $NH_3$ and/or $H_2$. It has been found that suitable RPCVD growth can be achieved with $NH_3$ and/or $H_2$ and passivation of the p-type layer avoided. In certain embodiments, the RPCVD conditions include substantially no $H_2$ in the growth chamber. While MOCVD growth may potentially be performed with relatively low levels of hydrogen, the presence of ammonia is required which is pyrolyzed to thereby generate hydrogen and a variety of radical species. It is the combination of the presence of plasma and relatively low overpressure of $NH_3$ and/or $H_2$ which provide the present benefits of RPCVD n-type layer overgrowth. Therefore, in certain embodiments, the RPCVD conditions for n-type layer overgrowth include substantially no $NH_3$ in the growth chamber.

The RPCVD growth procedures may be carried out using the processes, conditions and apparatus as generally described in any one or more embodiments of the applicant's earlier international publication, WO 2014/008557, the contents of which is hereby incorporated by reference in its entirety.

In general terms, the RPCVD apparatus will comprise a growth chamber inside which semiconductor layer growth will occur. Located within the growth chamber is a substrate which is supported by a substrate holder which may include or be connected to a heater to allow the substrate to be adjusted to growth temperatures. The substrate may comprise sapphire, SiC, silica, soda lime glass, borosilicate glass, Pyrex®, silicon, glass, synthetic sapphire, quartz, zinc oxide, nitride coated substrates and other materials as are well known in the art including free standing bulk semiconductor substrates and nitride templates. A plasma inlet, located at a distance from the substrate, allows for entry of the Group V plasma formed in, for example, a high frequency generator, into the growth chamber. The high frequency generator acts on a region of the apparatus receiving nitrogen from a nitrogen source. A Group III reagent source, which is usually also at a distance from the substrate, introduces the metal organic into a flow path which delivers the reagent to a metal organic injector for dispersion into the growth chamber.

The plasma enters an area of the growth chamber directly above the metal organic injector and so, in operation, the plasma containing active neutral nitrogen species and the metal organic reagent mix and react to form the particular metal nitride, such as gallium nitride, which is deposited on the substrate to form the film. Doping reagents can be introduced in a similar manner. Excess reagents, carrier gases, contaminants etc. are removed via a waste outlet.

In one embodiment, the method further includes the step of growing the p-type Group III nitride semiconductor layer under MOCVD conditions, as described above and as will be generally known in the art. In this embodiment, the MOCVD growth of the p-type Group III nitride semiconductor layer and the RPCVD growth of the n-type Group III nitride semiconductor layer occur in the same growth chamber. This is created by the same hybrid apparatus being switched between an MOCVD relatively high pressure, high temperature growth mode in the presence of $NH_3$ and $H_2$ and an RPCVD comparatively low pressure and low temperature. The RPCVD apparatus may be generally arranged as already described but with simple modifications to allow switching to a high pressure environment and with appropriate gas supply. It has been found that the use of a hybrid apparatus which can be alternately run in MOCVD and RPCVD modes provides significant advantages in operation.

For example, hybrid growth enables an MOCVD to RPCVD transition in situ and without cooling of the substrate. This can improve the quality of the transition interface. Typically a structure grown using two such techniques will contain a re-growth interface. This interface will often have impurities or contaminants that form on the first layer during the transfer from the environment of the first process to that of the second process and thereby remain buried by the second layer. Therefore, a clean transition between two processes at a critical interface, such as a tunnel junction interface for example, may be difficult to achieve unless the two processes are truly hybrid and can be run in the same reactor with only nominal changes to process parameters, such as pressure. Additionally, such a hybrid approach also provides for growth at high temperatures in $NH_3$ and $H_2$, where appropriate such as during MOCVD growth, and growth at low temperatures with low flows of $H_2$ or $NH_3$ where required, such as with RPCVD growth.

Therefore, in one embodiment, the hybrid growth requires only a change in certain process parameters and not a change in physical location of the substrate/growing film between the first growth process and second growth process. That is, the growth of all of the layers of the semiconductor device may occur in the same chamber. The parameters which may be changed include pressure, temperature and $NH_3$ and/or $H_2$ concentrations and or flow rates per growth chamber volume.

In one embodiment, neither the p-type Group III nitride semiconductor layer nor the n-type Group III nitride semiconductor layers are grown by molecular beam epitaxy (MBE). Preferably, none of the semiconductor layers of the semiconductor structure formed by the first aspect are grown by MBE. While MBE may be used to attempt to avoid forming a buried and passivated p-type layer, the process has a number of significant commercial drawbacks. Particularly, the throughput rate in MBE is relatively low which more or less precludes extensive commercial use in semiconductor device formation. The ultra-high vacuum conditions greatly increase costs and require significant preparation and maintenance time. The process growth window for nitrides is also narrower than growth using RPCVD. Further, MBE will not provide all of the advantages, discussed below, which RPCVD growth can provide.

As will be clear from the discussion herein, the n-type overgrown semiconductor layer of the first aspect is not grown under MOCVD or HVPE or related relatively high temperature and high $H_2/NH_3$ environment processes.

The one or more additional semiconductor layers grown between the p-type Group III nitride semiconductor layer grown in the hydrogen environment and the n-type Group III nitride semiconductor layer may be grown under MOCVD or RPCVD conditions. In one embodiment, it may be desirable to firstly overgrow an additional p-type Group III nitride semiconductor layer on top of the p-type Group III nitride semiconductor layer, as was discussed above, but to do so under RPCVD conditions. This approach can provide a number of advantages including the ability to grow a highly doped p-type layer at low temperatures and potentially achieving a lower resistivity p-type layer at those temperatures than can be achieved using MOCVD.

The method may further include the step of controlling the temperature in the growth chamber, during RPCVD growth, to be between about 400° C. to about 1,000° C., about 500° C. to about 1,000° C., about 600° C. to about 1000° C., about 700° C. to about 1,000° C.; or between about 400° C. to about 950° C., about 500° C. to 950° C., about 600° C. to 950° C., about 700° C. to about 950° C., or even between about 400° C. to about 900° C., about 500° C. to 900° C., about 600° C. to 900° C. or about 700° C. to 900° C. The broader temperature ranges are inclusive of a temperature of about 500° C., 600° C., 700° C., 800° C., and 900° C. A growth temperature range can be between about 750° C. to about 850° C.

The use of RPCVD conditions for the growth of at least the n-type Group III semiconductor layer provides for significant advantages in operation, many of which can be linked to growth at lower temperatures compared with MOCVD. Growth at lower temperature may prevent damage, or limit diffusion, to previously deposited layers such as indium-rich quantum wells forming active layers in the case of LEDs and solar cells. RPCVD can be used to produce better film quality than MOCVD films grown at the same temperature, with lower background impurities and in particular lower levels of carbon. Further, the lower temperature growth of RPCVD can reduce the back diffusion of Mg from existing p-GaN layers into the layers beneath. For example, it may prevent Mg diffusion from p-GaN layers into multi-quantum well (MQW) layers which may be located below. This can result in improvements in internal quantum efficiency (IQE) due to less defect-related carrier transport from less Mg diffusion into the MQWs. Similarly, lower growth temperatures will prevent the forward diffusion of Mg from the as-grown p-GaN layer up into the next layer being grown. For example, in the case of a tunnel junction, preventing the Mg diffusing upwards from a p-GaN layer into the highly-doped n-GaN layer above. This creates a sharp n-p junction that will minimize the depletion width and maximize the tunneling probability, thus reducing the voltage drop across the tunnel junction and increasing the semiconductor device efficiency.

The use of RPCVD conditions also results in usefully high carrier concentrations in the semiconductor layers. It can be difficult to achieve high carrier concentration with low resistivity at the low growth temperatures which are required for overgrowing on indium-rich MQWs. For p-GaN growth, for example, growth temperature and Mg levels both contribute to the degree of diffusion and so the higher the doping concentration the lower the growth temperature required to prevent diffusion. RPCVD growth conditions can deliver this combination of low growth temperature with high carrier concentration and provide semiconductor layer interfaces sharp enough to achieve low tunneling resistance. This may be extremely advantageous in a range of applications such as for LEDs, solar cells, HEMT and the like.

It is a further advantage of the use of an overgrowth step to grow an n-type Group III nitride semiconductor layer under RPCVD conditions such that a separate dedicated activation step, such as exposing the layer to a $H_2$ free or low $H_2$ environment at high temperature, as is often employed in MOCVD growth alone, is unnecessary. The temperatures employed in the RPCVD cleaning and chamber preparation are sufficient to activate the p-type GaN layer and/or keep the p-type GaN layer activated prior to overgrowth of the n-type Group II nitride semiconductor layer.

The method may further include the step of controlling the pressure in the growth chamber, during RPCVD growth of the overgrown n-type layer, to be between about 0.1 Torr to 300 Torr, between about 0.1 Torr to 100 Torr, more between about 0.1 Torr to 50 Torr, even more y between about 0.1 Torr to 25 Torr or 0.1 Torr to 15 Torr. In embodiments, the pressure in the growth chamber, during RPCVD growth of the overgrown n-type layer, may be between about 0.5 Torr to 300 Torr, between about 0.5 Torr to 100 Torr, more between about 0.5 Torr to 50 Torr, even more between about 0.5 Torr to 25 Torr or 0.5 Torr to 15 Torr. Typical growth pressures are between about 1.0 Torr to about 10 Torr.

In one embodiment, one or more further semiconductor layers may be grown on top of the n-type Group III nitride semiconductor layer in an MOCVD growth environment. The further layers are can be Group III nitride semiconductor layers. This ability stems from the fact, previously discussed, that once the p-type Group III nitride semiconductor layer has been overgrown by the n-type Group III nitride semiconductor layer and left in an activated state, then further growth in a hydrogen-rich environment cannot passivate this buried layer. It is therefore possible, for example, to grow an LED in MOCVD conditions and then grow a tunnel junction on top of this, using RPCVD conditions according to the method of the first aspect, and then grow a further LED structure on top of this tunnel junction. This can be repeated, as desired, to generate a multi-junction device. Advantageously, this MOCVD-RPCVD-MOCVD repetitive growth cycle can all be performed in the one growth chamber when using a hybrid apparatus, as discussed above. Electrical contacts and the like can be added to the device by methods commonly known in the art to thereby form the final semiconductor device. It may be advantageous to end the growth of semiconductor layers with an n-type layer, optionally grown under RPCVD conditions, as an n-type layer has a higher conductivity and is therefore beneficial to attach a metal contact to as an effective current spreading layer. Additionally, it is also more straightforward to form an ohmic contact to an n-type GaN layer than to a p-type GaN layer. An ohmic contact is the desired contact that is made between the semiconductor and a metal and is required to form semiconductor devices.

In one embodiment, the method of the first aspect does not require an etching step to activate a buried p-type semiconductor layer.

Reference will now be made to a number of examples of semiconductor structures which can be made using the method of the first aspect. FIGS. 2A to 2E are schematic representations of a number of representative semiconductor structures which may be formed according to the method of the first aspect. It will be understood that these structures merely assist with understanding the invention and are not limiting upon the scope thereof. In these embodiments, the substrate and buffer layers may be selected from those materials previously discussed as suitable for such layers. In all embodiments, the buffer layer may be optional.

Figure 2A:
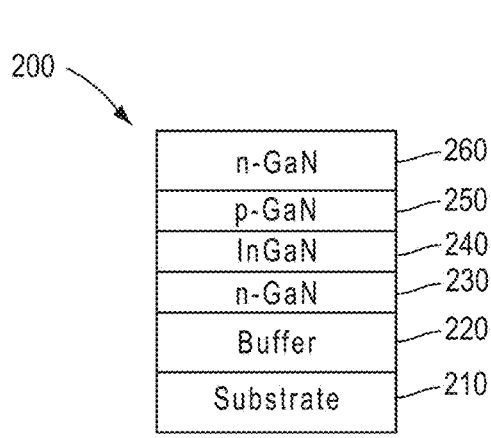
FIGS. 2A-2F are schematic representations of a number of representative semiconductor structures which may be formed according to the present invention.

FIG. 2A shows an embodiment of a semiconductor structure 200 analogous to that of FIG. 1. Again, additional semiconductor layers 240 have been grown in between the n-GaN layer 230 and p-GaN layer 250. In the embodiment shown, the additional semiconductor layers 240 represent an active layer formed by one or more InGaN layers 240. Layer 240 may comprise a QW or may form an MQW structure. In forming this structure, the substrate 210 may have a buffer layer, for example a GaN layer 220, grown under MOCVD conditions on top of the substrate 210. An n-GaN layer 230 has been overgrown on the buffer layer 220, again in MOCVD mode. The InGaN layer 240 can then be grown on top of this using MOCVD to form a high quality active layer followed by growth a further p-GaN layer 250 which, if grown under MOCVD conditions will be passivated as discussed above. At this point, the apparatus can be switched to RPCVD growth conditions for overgrowth of the final n-GaN layer 260. In this manner a relatively simple LED or solar cell structure can be formed which results in an activated buried p-GaN layer 250 with an n-GaN overgrowth layer 260, grown by RPCVD, to prevent hydrogen ingress into the buried p-GaN layer 250.

Figure 2B:
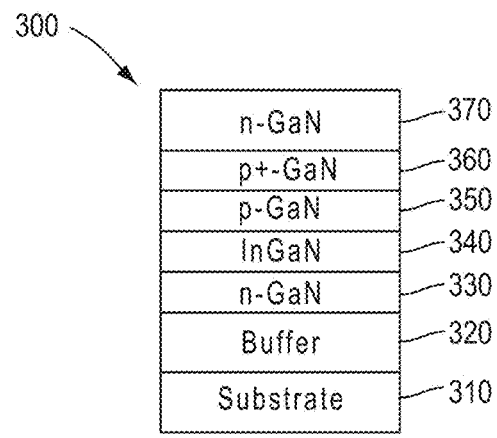

FIG. 2B shows an embodiment of a semiconductor structure 300 which closely corresponds to structure 200 of FIG. 2A but with an additional p-type layer 360 which is grown under low or no hydrogen RPCVD conditions. As was discussed previously, any semiconductor layer described herein may, in fact, be constructed from multiple layers. In FIG. 2B the p-GaN layer 250 of FIG. 2A can be considered to have been divided into two layers. However, the layers are grown under different conditions to provide the benefits of the present approach. The substrate 310, buffer layer 320, n-GaN layer 330, InGaN active layer 340 and p-GaN layer 350 correspond with those layers in FIG. 2A and n-GaN layer 330, InGaN active layer 340 and p-GaN layer 350 may be grown in MOCVD mode or other hydrogen rich growth environment. For example, in an alternative embodiment, p-GaN layer 350 may be grown by RPCVD but subjected to a hydrogen rich growth environment. In any event, at this point p-GaN layer 360 is grown under RPCVD low hydrogen conditions. The exposure to RPCVD plasma conditions for the growth of p-GaN layer 360 causes activation of the underlying MOCVD or other hydrogen-rich environment grown p-GaN layer 350. The final n-GaN layer 370 is then overgrown over both of these p-type layers to cap them and maintain their activated state through any further processing or growth the structure 300 may be subjected to.

Figure 2C:
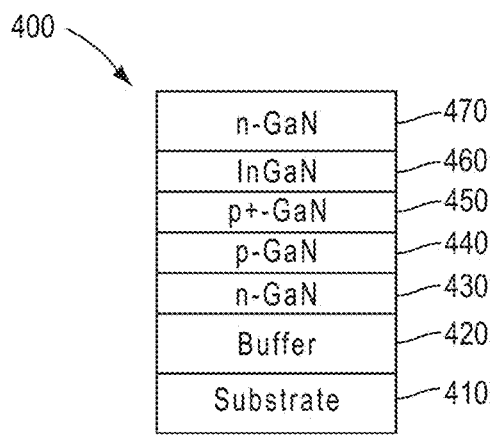

FIG. 2C shows an embodiment of a semiconductor structure 400 which generally corresponds to FIG. 2A but with an additional semiconductor layer 450 in the form of a highly doped $p^+$-GaN layer 450. The $p^+$-GaN layer 450 may be grown under RPCVD low hydrogen conditions to provide a thin p-type layer on which to overgrow the subsequent active layers 460 and the final capping n-GaN layer 470. The buffer layer 420, the n-GaN layer 430 and the p-GaN layer 440 are grown on the substrate 410, under MOCVD conditions, as discussed for FIG. 2A.

Figure 2D:
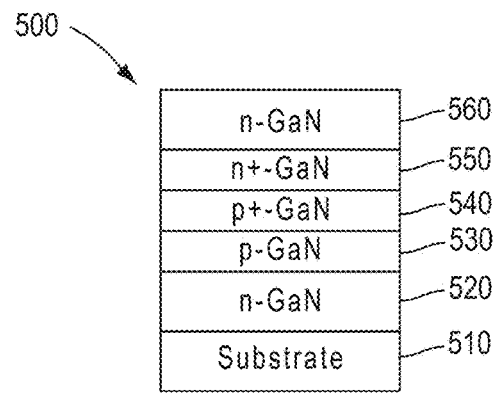

FIG. 2D shows an embodiment of a semiconductor structure 500 wherein an n-GaN layer 520 and a p-GaN layer 530 are grown on a substrate 510, all under MOCVD conditions. The hybrid apparatus can then be switched to RPCVD growth conditions for growth of a highly doped $p^+$-GaN layer 540. The use of RPCVD conditions allows for higher doping levels and a lower resistivity to be achieved than if the layer had been grown at the same temperature using MOCVD conditions. A highly doped $n^+$-GaN layer 550 is then grown under RPCVD conditions to thereby form a tunnel junction on top of the lower MOCVD grown n-GaN layer 520 and p-GaN layer 530. Finally, the uppermost n-GaN layer 560 is grown under RPCVD growth conditions to again leave a buried MOCVD-grown p-GaN layer 530 with an overgrown n-GaN layer 560 (and doped $n^+$-GaN layer 550). The uppermost n-GaN layer 560 also provides for a useful uniform current spreading and carrier injection layer. As with all of the embodiments shown herein, the standard metal contacts have not been shown.

Figure 2E:
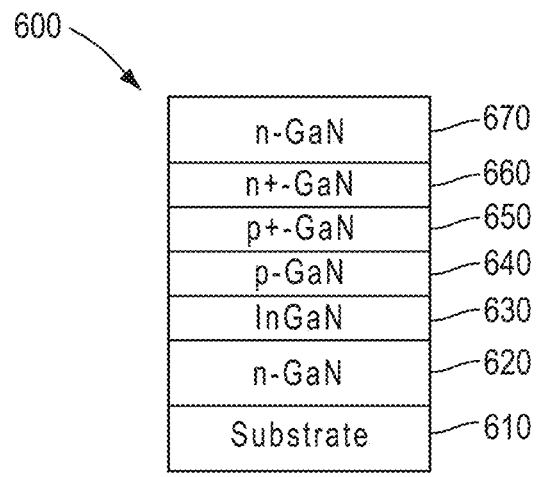

FIG. 2E shows an embodiment of a semiconductor structure 600 which is essentially identical to the structure 500 in FIG. 2D but with an active layer 630, grown under MOCVD conditions, located between the MOCVD-grown n-GaN layer 620 and p-GaN layer 640. As for FIG. 2E, in the embodiment shown, the active layer 630 is formed by one or more InGaN layers which may comprise single or multiple QWs. The remaining highly doped $p^+$-GaN layer 650, highly doped $n^+$-GaN layer 660 and the uppermost n-GaN layer 670 are all grown under RPCVD growth conditions. This results in a simple LED type structure, having been grown under MOCVD conditions and therefore presenting high quality layers 620, 630 and 640, with a tunnel junction (formed from layers 650 and 660) on top and the final n-GaN layer 670 to provide for a semiconductor structure having a buried activated p-GaN layer 640. The use of RPCVD conditions, as previously discussed, is highly beneficial in terms of employing a relatively low growth temperature to prevent damage to the already grown indium-containing active layer 630.

Figure 2F:
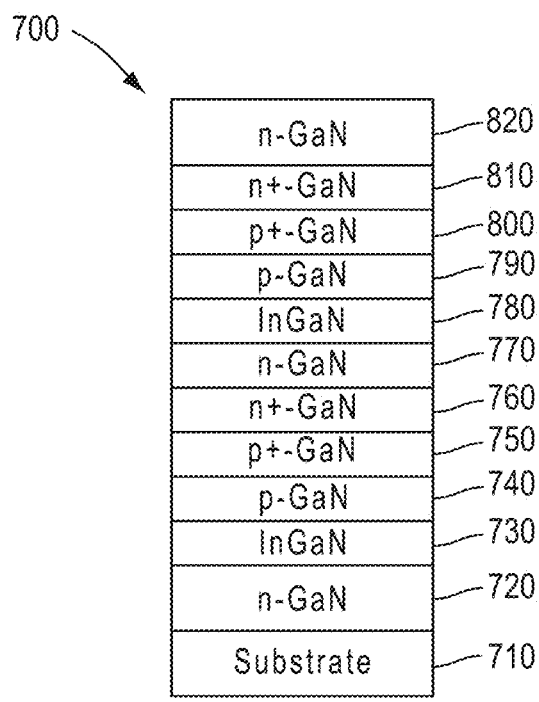

FIG. 2F indicates how the structures exemplified previously can be built into multi-junction devices. Semiconductor structure 700 resembles the structure 600 of FIG. 2E with layers 710-770 being identical. In addition to those of structure 600, however, a further active layer 780 has been grown on top of the RPCVD-grown n-GaN layer 770. This active layer 780 may be formed from any active semiconductor material but, in the embodiment shown is InGaN and may comprise QW or MQW structures as for active layer 730. The hybrid apparatus can advantageously be switched back to MOCVD mode for the growth of the active layer 780. This will not negatively impact upon the activation of the buried p-GaN layer 740 due to the capping n-GaN layer 770. The active layer 780 and an adjacent p-GaN layer 790 can therefore be grown under MOCVD conditions, if desired. Another tunnel junction, comprising a highly doped p$^+$-GaN layer 800 and a highly doped n$^+$-GaN layer 810, can then be grown under RPCVD growth conditions on top of the p-GaN layer 790 with a final RPCVD grown n-GaN layer 820 grown as the uppermost layer. This provides for a semiconductor structure 700 having two active regions, two tunnel junctions and two buried, but activated, MOCVD grown p-GaN layers. This provides for a device demonstrating useful efficiency when employed within a solar cell or other optoelectronic device. The semiconductor structure 700 shown in FIG. 2F includes substrate 710, n-GaN layer 720, InGaN layer 730, p-GaN layer 740, p$^+$-GaN layer 750, n$^+$-GaN layer 760, n-GaN layer 770, InGaN layer 780, p-GaN layer 790, p$^+$-GaN layer 800, n$^+$-GaN layer 810, and n-GaN layer 820.

It will be appreciated that while the layers of the semiconductor structures shown in FIGS. 2A to 2F, and other structures described herein, are generally discussed as discrete layers, in practice they may be constructed from a number of individual layers of the same or different Group III nitride composition. For example, the MOCVD-grown p-type or n-type layers may be formed from any number of individual layers which, while all being p- or n-type, may have varying Group III nitride compositions.

In one embodiment, the method may further include the step of growing, under MOCVD conditions, a thin p-type Group III nitride semiconductor layer on top of an existing Group III nitride semiconductor layer prior to growing the immediately adjacent semiconductor layer under RPCVD conditions. This can be looked at as the forming of a seed layer, under MOCVD conditions, prior to subsequent RPCVD growth which may have advantages in operation.

Without wishing to be bound by any particular theory, it is postulated that the overgrown RPCVD will mimic the crystal that it is grown on. If the underlying crystal is a high quality MOCVD-grown GaN layer, then RPCVD may continue the growth with equal quality. As previously mentioned, the regrowth interface will often contain impurities or contaminants and this may prevent the continuation of quality between the two differently grown layers. By starting the growth using MOCVD conditions, the regrowth interface is buried using MOCVD conditions and the transition from MOCVD to RPCVD is then performed in situ in a single reactor thereby improving the coherency between the two processes.

Alternatively, in between any MOCVD grown p-type Group III nitride semiconductor layer and a subsequent RPCVD grown highly doped p$^+$-type Group III nitride layer the method may include the step of growing an additional thin RPCVD grown p-type Group III nitride semiconductor layer directly on top of the MOCVD grown p-type Group III nitride semiconductor layer. The further RPCVD grown layers can then be grown on top of this thin layer.

In a second aspect, the invention resides in a semiconductor structure made by the method of the first aspect.

The details of the structure and the various conditions for growth are as already described for the first aspect.

In a third aspect, the invention resides in the use of a semiconductor structure of the second aspect in a semiconductor device. The semiconductor device may be any already known in the art to require the use of semiconductor structures, as have been described herein. Common examples as LEDs, solar cells, HEMTs and other transistors, laser diodes, vertical cavity surface emitting lasers and the like.

By exposing a p-(Al,In)GaN layer to a composition comprising NH$_3$ and H$_2$ before growing overlying semiconductor layers, a semiconductor tunnel junction structure with a lower resistance can be grown.

A method of fabricating a semiconductor structure comprising a buried activated p-(Al,In)GaN layer comprises providing a p-(Al,In)GaN layer, treating the p-(Al,In)GaN layer with a gaseous composition, and growing one or more semiconductor layers overlying the treated p-(Al,In)GaN layer, to provide a buried activated p-(Al,In)GaN layer.

Methods of fabricating a semiconductor structure comprising a buried activated p-(Al,In)GaN layer can comprise (a) exposing a magnesium-doped p-(Al,In)GaN layer to H$_2$, NH$_3$, or both H$_2$ and NH$_3$, wherein a partial pressure of H$_2$ is less than 760 Torr, to provide an exposed magnesium-doped p-(Al,In)GaN layer; and (b) growing an n-(Al,In)GaN layer on the exposed magnesium-doped p-(Al,In)GaN layer in an environment comprising H$_2$, NH$_3$, or both H$_2$ and NH$_3$, to provide a semiconductor structure comprising a buried activated p-(Al,In)GaN layer.

Methods of fabricating a semiconductor structure can comprising a buried activated p-(Al,In)GaN layer, can comprise: (a) exposing a magnesium-doped p-(Al,In)GaN layer to a gaseous mixture comprising H$_2$, NH$_3$, or a combination thereof, wherein a partial pressure of H$_2$ is less than 760 Torr, to provide an exposed magnesium-doped p-(Al,In)GaN layer; and (b) growing an n-(Al,In)GaN layer on the exposed magnesium-doped p-(Al,In)GaN layer in an environment comprising H$_2$, NH$_3$, or a combination thereof, to provide a semiconductor structure comprising a buried activated p-(Al,In)GaN layer. The methods can consist of steps (a) and (b). In step (a) the gaseous mixture may not comprise N$_2$.

After step (a) the temperature can be reduced to within a range from 400° C. to 1,050° C. while maintaining the partial pressure of H$_2$ within a range from 1 Torr to 300 Torr.

In step (b) growing the n-(Al,In)GaN layer can comprise growing an n-(Al,In)GaN layer on the exposed magnesium-doped p-(Al,In)GaN layer by RPCVD in an environment wherein the partial pressure of H$_2$ can be greater than the partial pressure of N$_2$.

In step (b) growing the n-(Al,In)GaN layer can consist of growing an n-(Al,In)GaN layer on the exposed magnesium-doped p-(Al,In)GaN layer by RPCVD in an environment wherein the partial pressure of $H_2$ can be greater than the partial pressure of $N_2$.

In step (b) growing the n-(Al,In)GaN layer can comprise (i) growing a first n-(Al,In)GaN layer on the exposed magnesium-doped p-(Al,In)GaN layer by RPCVD in an environment, wherein the partial pressure of $N_2$ is greater than the partial pressure of $H_2$; and (ii) growing a second n-(Al,In)GaN layer on the first n-(Al,In)GaN layer by RPCVD in an environment wherein the partial pressure of $H_2$ is greater than the partial pressure of $N_2$. In step (b) growing the n-(Al,In)GaN layer can consist of step (i) and step (ii).

The thickness of the first n-(Al,In)GaN layer can be, for example, less than 30 nm, less than 25 nm, less than 20 nm, less than 10 nm, or less than 5 nm. The thickness of the second n-(Al,In)GaN layer can be, for example, greater than 10 nm, greater than 20 nm, or greater than 30 nm.

In step (i) growing the first n-(Al,In)GaN layer can comprise growing at a pressure, for example, from 0.1 Torr to 10 Torr and a temperature from 500° C. to 1,050° C.

In step (ii) growing the second n-(Al,In)GaN layer can comprise growing in the presence of $H_2$ and $NH_3$ at a pressure, for example, from 0.1 Torr to 10 Torr and a temperature from 500° C. to 1,050° C.

A p-(Al,In)GaN layer can comprise p-GaN, p-AlGaN, p-InGaN, or p-AlInGaN. The p-(Al,In)GaN layer can have a concentration of a p-type dopant such as Mg or Zn, within a range, for examples, from $1E19\ cm^{-3}$ to $5E21\ cm^{-3}$, from $5E19\ cm^{-3}$ to $1E21\ cm^{-3}$, or from $1E20\ cm^{-3}$ to $5E20\ cm^{-3}$. The p-type dopant can be magnesium and the p-(Al,In)GaN layer can be a magnesium-doped p-(Al,In)GaN layer such as a magnesium-doped p-GaN layer. A p-(Al,In)GaN layer can comprise two or more p-(Al,In)GaN layers, with each layer having a different composition, a different concentration of a p-type dopant, and/or a different p-type dopant concentration.

A p-(Al,In)GaN layer can comprise one or more p-(Al,In)GaN layers. When a p-(Al,In)GaN layer comprises two or more p-(Al,In)GaN layers each of the p-(Al,In)GaN layers can be grown under different conditions, such as a different gaseous composition, a different pressure, different partial pressures of gases, different wafer/carrier temperatures, and/or different durations. For example, a p-(Al,In)GaN layer can comprise a first layer having a first p-type dopant concentration, and a second layer having a higher p-type dopant concentration, such as a $p^{++}$-(Al,In)GaN layer.

A p-(Al,In)GaN layer can be grown on a substrate using any suitable deposition method such as by MBE, MOCVD, or RPCVD. The substrate may be an active substrate such as a top surface of an optoelectronic structure. The p-(Al,In)GaN layer can be grown in the presence of $H_2$ and/or $NH_3$ and/or can be exposed to $H_2$ and/or $NH_3$ such that the p-(Al,In)GaN layer is passivated. The substrate can be any suitable material.

A p-(Al,In)GaN layer can be an activated p-(Al,In)GaN layer, can be a fully activated p-(Al,In)GaN layer, can be a partially activated p-(Al,In)GaN layer, can be an at least partially activated p-(Al,In)GaN layer, or can be a passivated p-(Al,In)GaN layer.

The p-(Al,In)GaN layer can be exposed to a gaseous composition comprising $H_2$ and $NH_3$. The ratio of the $H_2$ flow rate to the $NH_3$ flow rate in a chamber can be, for examples, from 1:1 to 5:1, from 1.5:1 to 4.5:1, from 2:1 to 4:1 or from 2:1 to 3:1. The pressure in the exposure chamber can be, for example, from 1 Torr to 760 Torr, from 1 Torr to 500 Torr, from 1 Torr to 300 Torr, from 5 Torr to 275 Torr, from 10 Torr to 250 Torr, or from 50 Torr to 200 Torr. For example, the chamber pressure can be up to 300 Torr, up to 275 Torr, up to 250 Torr, up to 200 Torr, or up to 150 Torr. The exposure temperature can be, for example, greater than 500° C., greater than 600° C., greater than 700° C., greater than 800° C., greater than 850° C., greater than 900° C. greater than 950° C., greater than 1000° C., greater than 1100° C. or greater than 1200° C. For example, the exposure temperature can be from 500° C. to 1200° C., from 500° C. to 1100° C., from 500° C. to 1050° C., from 600° C. to 1,050° C., from 700° C. to 1,050° C., or from 800° C. to 1,050° C. The exposure can be, for example, less than 5 minutes, less than 4 minutes, less than 2 minutes, or less than 1 minute. For example, the exposure can be from 0.5 minutes to 5 minutes, from 1 minute to 4 minutes or from 1 minute to 3 minutes.

For example, the p-(Al,In)GaN layer can be exposed to a gaseous composition comprising $H_2$ and $NH_3$, wherein the ratio of the $H_2$ flow rate to the $NH_3$ flow rate can be from 1:1 to 5:1, the chamber pressure can be from 1 Torr to 300 Torr, and the exposure temperature can be greater than 500° C. such as from 700° C. to 1200° C., or from 800° C. to 1100° C. For example, the p-(Al,In)GaN layer can be exposed to a gaseous composition comprising $H_2$ and $NH_3$, wherein the ratio of the $H_2$ flow rate to the $NH_3$ flow rate can be from 2:1 to 3:1, the chamber pressure can be, for example, from 100 Torr to 250 Torr, and the exposure temperature can be greater than 850° C. such as from 875° C. to 1,050° C. For example, the magnesium-doped p-(Al,In)GaN layer can be exposed to a partial pressure of $H_2$ less than 300 Torr and to a temperature less than 900° C.

During exposure, the partial pressure of $H_2$ can be, for example, less than 300 Torr, less than 250 Torr, less than 200 Torr, less than 100 Torr, less than 50 Torr or less than 10 Torr. During exposure, the partial pressure of $H_2$ can be, for example, from 0.1 Torr to 300 Torr, from 1 Torr to 300 Torr, from 1 Torr to 200 Torr, from 1 Torr to 100 Torr, from 1 Torr to 50 Torr, or from 1 Torr to 10 Torr.

The exposure at these conditions can be, for example, greater than 30 sec, greater than 60 sec, greater than 120 sec, or greater than 240 sec. The exposure at these conditions can be, for example, from 15 sec to 360 sec, from 30 sec to 240 sec, or from 60 sec to 120 sec. The exposure can be, for example, less than 6 minutes, less than 5 minutes, less than 4 minutes, less than 3 minutes, less than 2 minutes, or less than 1 minute.

After the surface of the p-(Al,In)GaN layer is exposed to the $H_2$ and $NH_3$ environment at modest pressures and elevated temperatures, the temperature of the p-(Al,In)GaN layer can be decreased to a temperature, for example, less than 1,050° C., less than 900° C., less than 850° C., less than 800° C., less than 700° C., or less than 600° C. For example, the temperature can be reduced to from 400° C. to 1000° C., from 450° C. to 900° C., from 500° C. to 850° C., from 550° C. to 800° C., or from 600° C. to 750° C. The temperature can be reduced to a typical RPCVD growth temperature such as from 500° C. to 850° C.

The temperature can be reduced from the $NH_3:H_2$-exposure temperature within, for example, less than 5 min, less than 4 min, less than 3 min, less than 2 min, or less than 1 min.

While the substrate/wafer is cooling, the p-(Al,In)GaN layer can be exposed to $H_2$ and $NH_3$ with the relative flow ratio and chamber pressures as in the $NH_3:H_2$-exposure step. For example, while the substrate/wafer is cooling the ratio of the $H_2$ flow rate to the $NH_3$ flow rate can be from 1:1 to 5:1, and the chamber pressure can be from 25 Torr to 400 Torr.

For example, while the substrate/wafer is cooling the ratio of the $H_2$ flow rate to the $NH_3$ flow rate can be from 2:1 to 3:1, and the chamber pressure can be from 100 Torr to 250 Torr.

While the temperature of the p-(Al,In)GaN layer is reduced, the partial pressure of $H_2$ can be, for example, less than 760 Torr, less than 500 Torr, less than 300 Torr, less than 250 Torr, less than 200 Torr, less than 100 Torr, less than 50 Torr or less than 10 Torr. During exposure, the partial pressure of $H_2$ can be, for example, from 0.1 Torr to 300 Torr, from 1 Torr to 300 Torr, from 1 Torr to 200 Torr, from 1 Torr to 100 Torr, from 1 Torr to 50 Torr, or from 1 Torr to 10 Torr.

The cooled, $NH_3$:$H_2$-exposed p-(Al,In)GaN layer can then be exposed to a $N_2$ plasma at a chamber pressure, for example, from 0.1 Torr to 100 Torr, such as from 1 Torr to 10 Torr, in a $H_2$ and/or $NH_3$ environment. The duration of the $N_2$ plasma exposure can be, for example, greater than 30 sec, greater than 60 sec, greater than 90 sec, or greater than 120 sec. The duration of $N_2$ plasma exposure can be, for example, from 15 sec to 360 sec, from 30 sec to 300 sec, from 60 sec to 240 sec, or from 90 sec to 210 sec. The chamber pressure during the $N_2$ plasma exposure can be, for example, from 0.2 Torr to 50 Torr, from 0.5 Torr to 25 Torr, or from 1 Torr to 10 Torr.

After the temperature is reduced, an n-(Al,In)GaN layer can be grown on the exposed p-(Al,In)GaN layer. The n-(Al,In)GaN layer can be grown in an environment comprising $H_2$, $NH_3$, or both $H_2$ and $NH_3$.

The n-(Al,In)GaN layer can be grown in an environment in which the partial pressure of $H_2$ is, for example, less than 300 Torr, less than 200 Torr, less than 100 Torr, less than 50 Torr, or less than 10 Torr. The n-(Al,In)GaN layer can be grown in an environment in which the partial pressure of $H_2$ is, for example, from 0.1 Torr to 300 Torr, from 0.1 Torr to 200 Torr, from 0.1 Torr to 100 Torr, from 0.1 Torr to 50 Torr, or from 0.1 Torr to 10 Torr.

Growing a n-(Al,In)GaN layer can comprise (i) growing a first n-(Al,In)GaN layer; and (ii) growing a second n-(Al,In)GaN layer overlying the first n-(Al,In)GaN layer. Growing an n-(Al,In)GaN layer can comprise (i) growing a first n-(Al,In)GaN layer in an environment wherein a partial pressure of $H_2$ is from 0.1 Torr to 300 Torr; and (ii) growing a second n-(Al,In)GaN layer overlying the first n-(Al,In)GaN layer in an environment wherein the partial pressure of $H_2$ is greater than 0.1 Torr.

The first n-(Al,In)GaN layer can have a thickness, for example, less than 30 mm, less than 20 mm, less than 10 nm, less than 8 nm, less than 6 nm, less than 4 nm, or less than 2 nm. The first n-(Al,In)GaN layer can have a thickness, for example, from 1 nm to 10 nm, from 1 nm to 8 nm, from 1 nm to 6 nm, from 1 nm to 4 nm, or from 1 nm to 2 nm. The first n-(Al,In)GaN layer can be deposited at a partial pressure of $N_2$, for example, from 0.1 Torr to 760 Torr, from 0.1 Torr to 500 Torr, from 0.1 Torr to 300 Torr, from 0.1 Torr to 200 Torr, from 0.1 Torr to 100 Torr, or from 1 Torr to 50 Torr. The n-(Al,In)GaN layer growth temperature can be, for example, less than 1,050° C., less than 950° C., less than 850° C., less than 800° C., less than 700° C., or less than 600° C. For example, the temperature for growing the first n-(Al,In)GaN layer can be from 400° C. to 850° C., from 450° C. to 800° C., from 500° C. to 750° C., from 400° C. to 700° C., or from 500° C. to 650° C. The first n-(Al,In)GaN layer can be grown in a $H_2$ environment. The growth conditions for the first n-(Al,In)GaN layer can be typical RPCVD growth conditions. The first n-(Al,In)GaN layer can be grown, for example, at a partial pressure of $N_2$ from 0.1 Torr to 300 Torr or from 0.1 Torr to 10 Torr and at a temperature from 500° C. to 1,050° C.

After the first n-(Al,In)GaN layer is grown, a second, thicker n-(Al,In)GaN layer can be grown on the thin n-(Al,In)GaN layer. Both layers can be grown in the presence of $H_2$ and $NH_3$, in a high $H_2$ environment, at a chamber pressure from 0.1 Torr to 100 Torr, and at a temperature less than 1,050° C. For example, the second n-(Al,In)GaN layer can be grown at a chamber pressure from 0.1 Torr to 100 Torr, from 0.2 Torr to 50 Torr, from 0.5 Torr to 25 Torr, or from 1 Torr to 10 Torr. The growth temperature can be, for example, less than 850° C., less than 800° C., less than 700° C., or less than 600° C. For example, the temperature for growing the second n-(Al,In)GaN layer can be from 400° C. to 1,050° C., from 450° C. to 900° C., from 500° C. to 850° C., from 550° C. to 800° C., or from 600° C. to 750° C. The second n-(Al,In)GaN layer can be grown in a high $H_2$ environment where the $H_2$ concentration can be, for example, greater than 10 Torr, greater than 100 Torr, or greater than 250 Torr. The growth conditions for the second n-(Al,In)GaN layer can be typical RPCVD growth conditions with the exception that a high $H_2$ environment can be used. The second n-(Al,In)GaN layer can also be grown in a low $H_2$ environment.

The first n-(Al,In)GaN layer can be thinner than the capping layer typically used to protect an underlying activated p-(Al,In)GaN layer from in-diffusion of $H_2$ that would otherwise cause the p-(Al,In)GaN layer to become passivated.

Alternatively, the second n-(Al,In)GaN layer can be grown by any suitable semiconductor deposition method such as by MOCVD, by RPCVD, or by MBE. The n-(Al,In)GaN layer can be grown in in the absence of $H_2$, in the presence of a low $H_2$ environment, or in the presence of a high $H_2$ environment.

For example, a method of fabricating a semiconductor structure comprising a buried activated p-(Al,In)GaN layer can comprise (a) exposing a magnesium-doped p-(Al,In)GaN layer to a gaseous mixture comprising $H_2$, $NH_3$, or a combination thereof, wherein the gaseous mixture has a partial pressure of $H_2$ less than 760 Torr, to provide an exposed magnesium-doped p-(Al,In)GaN layer; (b) growing a first n-(Al,In)GaN layer on the exposed magnesium-doped p-(Al,In)GaN layer by RPCVD in an environment wherein the partial pressure of $N_2$ is greater than the partial pressure of $H_2$; and (c) growing a second n-(Al,In)GaN layer on the first n-(Al,In)GaN layer by RPCVD in an environment wherein the partial pressure of $H_2$ is greater than the partial pressure of $N_2$; to provide a semiconductor structure comprising a buried activated p-(Al,In)GaN layer.

The method can consist of steps (a), (b), and (c). In step (a) the gaseous mixture can comprise $N_2$, or in certain embodiments the gaseous mixture does not comprise $N_2$.

An n-(Al,In)GaN layer can be grown in the presence of $H_2$, $NH_3$, or a combination thereof.

An n-(Al,In)GaN layer can comprise one or more layers. When the n-(Al,In)GaN layer comprises two or more n-(Al,In)GaN layer, each of the layers can be grown using a different deposition process, using different gas compositions, at different temperatures, for different durations, or a combination of any of the foregoing. For example, an n-(Al,In)GaN layer can comprise a first layer having a first n-type dopant concentration, and a second layer having a higher n-type dopant concentration such as an $n^+$(Al,In)GaN layer. The n-(Al,In)GaN layer can have different elemental compositions.

Following growth of the n-(Al,In)GaN layers, the p-(Al,In)GaN layer is buried beneath the overlying n-(Al,In)GaN layers and is an activated p-(Al,In)GaN layer; hence, the p-(Al,In)GaN layer is a buried activated p-(Al,In)GaN layer.

As a result of these process steps, beginning with either a passivated, a partially passivated, or an activated p-(Al,In)GaN layer, which can be grown by any suitable method, a semiconductor structure having a buried activated p-(Al,In)GaN layer is formed. The process does not include a separate step of annealing the p-(Al,In)GaN layer in a low $H_2$ environment at high temperature to activate the p-(Al,In)GaN layer. For example, the process does not include exposing the p-(Al,In)GaN layer to a temperature of greater than 800° C. in a low $H_2$ environment that would cause $H_2$ to diffuse out of the p-(Al,In)GaN layer.

An n-(Al,In)GaN layer can comprise n-GaN, n-AlGaN, n-InGaN, or n-AlInGaN. The n-(Al,In)GaN layer can have a concentration of an n-type dopant such as Si or Ge, within a range, for example, from 1E18 $cm^{-3}$ to 5E20 $cm^{-3}$, from 5E18 $cm^{-3}$ to 1E20 $cm^{-3}$, or from 1E19 $cm^{-3}$ to 1E20 $cm^{-3}$. An n-(Al,In)GaN layer can comprise two or more n-(Al,In)GaN layers, with each layer having, for example, a different concentration of an n-type dopant and/or different n-type dopant concentration.

A p-(Al,In)GaN can comprise a $p^{++}$-(Al,In)GaN and a p-(Al,In)GaN layer, and an n-(Al,In)GaN can comprise an $n^{++}$-(Al,In)GaN and an n-(Al,In)GaN layer.

Tunnel junctions can have a total thickness, for example, from about 1 nm to 100 nm, and each of the $p^{++}$-(Al,In)GaN layer and the $n^{++}$-(Al,In)GaN layer can have a thickness, for example, from 0.5 nm to 50 nm. For example, each of the $p^{++}$-(Al,In)GaN layer and the $n^{++}$-(Al,In)GaN layer can have a thickness from 25 nm to 35 nm. A $p^{++}$-(Al,In)GaN layer and an $n^{++}$-(Al,In)GaN layer can have the same thickness or can have a different thickness. A $p^{++}$-(Al,In)GaN layer and an $n^{++}$-(Al,In)GaN layer may have a graded dopant concentration. For example, a portion of a $p^{++}$-(Al,In)GaN layer adjacent to the underlying p-type layer can have a dopant concentration that is graded from the dopant concentration of the underlying p-type layer to the desired dopant concentration in the $p^{++}$-(Al,In)GaN layer. Similarly, an $n^{++}$-(Al,In)GaN layer can have a dopant concentration that is graded from a maximum adjacent to the $p^{++}$-(Al,In)GaN layer to a minimum adjacent to an n-type layer formed over a tunnel junction. The thickness, doping concentration, doping profile and number of layers of a tunnel junction can be selected to exhibit a low series voltage drop when conducting current in reverse-biased mode. For example, a voltage drop across a tunnel junction can be, for example, less than 0.3 V at 10 $A/cm^2$ or less than 0.1V at 10 $A/cm^2$. Other suitable layers can be included between a $p^{++}$-(Al,In)GaN layer and an $n^{++}$-(Al,In)GaN layer to leverage the polarization field in III-nitrides to help align the bands for tunneling. This polarization effect may reduce the doping requirement in the $n^{++}$-(Al,In)GaN and $p^{++}$-(Al,In)GaN layers and reduce the tunneling distance required and thereby allow higher current flow. The composition of a layer or layers between a $p^{++}$-(Al,In)GaN layer and an $n^{++}$-(Al,In)GaN layer may be different from the composition of the $p^{++}$-(Al,In)GaN layer and the $n^{++}$-(Al,In)GaN layer, and/or may be selected to cause band re-alignment due to the polarization charge that exists between dissimilar material interface in the III-nitride material system. Examples of suitable tunnel junctions are described, for example, in U.S. Pat. No. 8,039,352 B2.

Additional semiconductor layers can be grown overlying the n-(Al,In)GaN layer.

After a semiconductor layer is grown on the processed p-(Al,In)GaN layer, such as an n-(Al,In)GaN layer, additional semiconductor layers can be grown using any suitable semiconductor growth method such as MOCVD, RPCVD, or MBE.

After growing the n-(Al,In)GaN layer, one or more semiconductor layers can be grown overlying the n-(Al,In)GaN layer to provide a buried activated p-(Al,In)GaN layer. For example, the one or more semiconductor layers can be grown in the presence of $H_2$, $NH_3$, or a combination thereof. Growing the one or more semiconductor layers does not result in the passivation of the buried activated p-(Al,In)GaN layer.

This result is not expected. First, if the starting p-(Al,In)GaN layer is passivated, the method does not include a high temperature anneal step in the absence of $H_2$ or in a low $H_2$ environment. Second, if the starting p-(Al,In)GaN layer is already activated, exposure of the p-(Al,In)GaN to hydrogen during the $H_2$:$NH_3$ exposure and/or during growth of the subsequent n-(Al,In)GaN layer(s) and the one or more semiconductor layers, would be expected to passivate the p-(Al,In)GaN layer.

To demonstrate the ability of methods provided by the present disclosure to produce high-quality buried activated p-(Al,In)GaN layers, p-(Al,In)GaN layer tunnel junctions were fabricated. n/p-(Al,In)GaN tunnel junctions fabricated using methods provided by the present disclosure can exhibit an voltage drop, for example, across the n/p-(Al,In)GaN tunnel junction of less than 0.3 V at 10 $A/cm^2$, less than 0.2 V at 10 $A/cm^2$, less than 0.1 V at 10 $A/cm^2$, or less than 0.05 V at 10 $A/cm^2$. n/p-(Al,In)GaN tunnel junctions fabricated using methods provided by the present disclosure exhibit an voltage drop, for example, across the n/p-(Al,In)GaN tunnel junction from 0.01 V to 0.3 V at 10 $A/cm^2$, from 0.05 V to 0.3 V at 10 $A/cm^2$, or from 0.1 V to 0.2 V at 10 $A/cm^2$.

Therefore, despite the presence of $H_2$ during growth of the n/p-(Al,In)GaN tunnel junction the method produces a high-quality n/p-(Al,In)GaN tunnel junction having a low voltage drop.

Methods of fabricating a semiconductor structure having a buried activated p-(Al,In)GaN layer or a device such as an n/p-(Al,In)GaN tunnel junction do not include a p-(Al,In)GaN activation step, where the activation step comprises, for example, exposing the p-(Al,In)GaN layer to a $H_2$-free environment at elevated temperature. In other words, methods provided by the present disclosure do not comprise exposing the p-(Al,In)GaN layer to an environment capable of passivating the p-(Al,In)GaN layer and/or subjecting the p-(Al,In)GaN layer to a separate activation step.

Methods provided by the present disclosure also do not include a lateral activation step. Structures or chips having a buried activated p-(Al,In)GaN layer provided by the present disclosure can have a minimum lateral dimensions greater than 100 μm×100 μm, greater than 200 μm×100 μm, greater than 300 μm×100 μm, or greater than 400 μm×100 um, or a chip can have dimensions a×b, where each of a and b is greater than 100 μm, greater than 200 μm, greater than 300 μm, or greater than 400 μm.

In a typical RPCVD process semiconductors are grown at low pressures, such as at pressures less than 10 Torr. In methods provided by the present disclosure, semiconductor growth process involves using a wide range of pressures such as at pressures greater than 100 Torr, and at pressures from 0.1 Torr to 10 Torr. The high pressure range facilitates pre-growth surface cleaning and modification, steps that are well suited to a higher pressure, while subsequently exposing the wafer to RPCVD conditions for low temperature growth. This combination of low and high pressure ranges is able to provide high quality tunnel junctions with superior compared to those fabricated using other growth techniques. For example, exposing a p-(Al,In)GaN layer to $H_2$, $NH_3$, or a combination thereof at a partial pressure of $H_2$ less than 300 Torr and a substrate temperature of less than 900° C. can serve as a cleaning step that can help produce high quality tunnel junctions. Using an RPCVD reactor that is capable of use at high pressures, and without a plasma, and can be switched to low pressure can improve the performance of tunnel junctions.

Methods provided by the present disclosure can be used to fabricate structures having a high-quality buried activated p-(Al,In)GaN layer.

The buried activated p-(Al,In)GaN layers and structures comprising buried activated p-(Al,In)GaN layers such as n/p-(Al,In)GaN tunnel junctions can be incorporated into any suitable semiconductor device.

For example, n/p-(Al,In)GaN tunnel junctions provided by the present disclosure can be incorporated into a device comprising two or more diodes and can be used to interconnect diodes.

For example, LEDs, laser diodes, photovoltaic devices, optoelectronic devices, multijunction solar cells, transistors, and power converters can incorporate one or more n/p-(Al,In)GaN tunnel junctions provide by the present disclosure.

A semiconductor device comprising an n/p-(Al,In)GaN tunnel junction provided by the present disclosure can include a stacked optoelectronic device such as a stacked LED structure, a stacked laser diode structure, a multijunction solar cell, a stacked transistor, or a stacked power converter. By stacked is meant that the optoelectronic device has two or more diodes or junctions that can be interconnected using an n/p-(Al,In)GaN tunnel junction provided by the present disclosure.

Thus, semiconductor devices provided by the present disclosure can comprise a buried activated p-(Al,In)GaN layer fabricated using the methods disclosed herein and/or an n/p-(Al,In)GaN fabricated using the methods disclosed herein.

n/p-(Al,In)GaN tunnel junctions can be used to replace conductive films such as conductive indium tin oxide (ITO) films used to interconnect to a semiconductor layer. Accordingly, semiconductor devices provided by the present disclosure can comprise an electrically conductive layer comprising an n/p-(Al,In)GaN tunnel junction.

ASPECTS OF THE INVENTION

The invention can be further defined by one or more of the following aspects.

Aspect 1. A method of fabricating a semiconductor structure comprising a buried activated p-(Al,In)GaN layer, comprising: (a) exposing a magnesium-doped p-(Al,In)GaN layer to a gaseous mixture comprising $H_2$, $NH_3$, or a combination thereof, wherein the gaseous mixture has a partial pressure of $H_2$ is less than 760 Torr, to provide an exposed magnesium-doped p-(Al,In)GaN layer; and (b) growing an n-(Al,In)GaN layer on the exposed magnesium-doped p-(Al,In)GaN layer in an environment comprising $H_2$, $NH_3$, or a combination thereof, to provide a semiconductor structure comprising a buried activated p-(Al,In)GaN layer.

Aspect 2. The method of aspect 1, wherein the method consists of: (a) exposing a magnesium-doped p-(Al,In)GaN layer to a gaseous mixture comprising $H_2$, $NH_3$, or a combination thereof, wherein a partial pressure of $H_2$ is less than 760 Torr, to provide an exposed magnesium-doped p-(Al,In)GaN layer; and (b) growing an n-(Al,In)GaN layer on the exposed magnesium-doped p-(Al,In)GaN layer in an environment comprising $H_2$, $NH_3$, or a combination thereof, to provide a semiconductor structure comprising a buried activated p-(Al,In)GaN layer.

Aspect 3. The method of any one of aspects 1 to 2, wherein in step (a), the gaseous mixture does not comprise $N_2$.

Aspect 4. The method of any one of aspects 1 to 3, wherein exposing comprises exposing comprises exposing the magnesium-doped p-(Al,In)GaN layer to a partial pressure of $H_2$ less than 300 Torr and to a temperature less than 900° C.

Aspect 5. The method of any one of aspects 1 to 4, wherein the magnesium doped p-(Al,In)GaN layer is a magnesium-doped p-GaN layer.

Aspect 6. The method of any one of aspects 1 to 4, wherein the magnesium-doped p-(Al,In)GaN layer is a passivated p-(Al,In)GaN layer.

Aspect 7. The method of any one of aspects 1 to 6, wherein the magnesium-doped p-(Al,In)GaN layer is a partially activated p-(Al,In)GaN layer.

Aspect 8. The method of any one of aspects 1 to 6, wherein the magnesium-doped p-(Al,In)GaN layer is a fully activated p-(Al,In)GaN layer.

Aspect 9. The method of any one of aspects 1 to 8, wherein the magnesium-doped p-(Al,In)GaN layer comprises a concentration of the magnesium dopant from 1E19 $cm^{-3}$ to 5E21 $cm^{-3}$.

Aspect 10. The method of any one of aspects 1 to 9, wherein the n-(Al,In)GaN layer comprises a concentration of an n-type dopant from 1E18 $cm^{-3}$ to 5E20 $cm^{-3}$.

Aspect 11. The method of any one of aspects 1 to 10, wherein exposing the magnesium-doped p-(Al,In)GaN layer comprises exposing for less than 5 minutes.

Aspect 12. The method of any one of aspects 1 to 11, wherein the partial pressure of $H_2$ is from 1 Torr to 300 Torr.

Aspect 13. The method of any one of aspects 1 to 12, wherein the partial pressure of $H_2$ is greater than 10 Torr.

Aspect 14. The method of any one of aspects 1 to 12, wherein the partial pressure of $H_2$ is greater than 100 Torr.

Aspect 15. The method of any one of aspects 1 to 14, wherein exposing the magnesium-doped p-(Al,In)GaN layer comprises exposing to a $N_2$ plasma.

Aspect 16. The method of any one of aspects 1 to 15, wherein growing the n-(Al,In)GaN layer comprises growing in an environment wherein a partial pressure of $H_2$ is from 0.1 Torr to 300 Torr.

Aspect 17. The method of any one of aspects 1 to 15, wherein growing the n-(Al,In)GaN layer comprises growing in an environment wherein a partial pressure of $H_2$ is from 0.1 Torr to 10 Torr.

Aspect 18. The method of any one of aspects 1 to 17, wherein after step (a); reducing the temperature to within a range from 400° C. to 1,050° C. and wherein the partial pressure of $H_2$ is from 1 Torr to 300 Torr.

Aspect 19. The method of any one of aspects 1 to 18, wherein (b) growing the n-(Al,In)GaN layer comprises growing an n-(Al,In)GaN layer on the exposed magnesium-doped p-(Al,In)GaN layer by RPCVD in an environment wherein the partial pressure of $H_2$ is greater than the partial pressure of $N_2$.

Aspect 20. The method of any one of aspects 1 to 18, wherein (b) growing the n-(Al,In)GaN layer consists of growing an n-(Al,In)GaN layer on the exposed magnesium-doped p-(Al,In)GaN layer by RPCVD in an environment wherein the partial pressure of $H_2$ is greater than the partial pressure of $N_2$.

Aspect 21. The method of any one of aspects 1 to 18, wherein (b) growing the n-(Al,In)GaN layer comprises: (i) growing a first n-(Al,In)GaN layer on the exposed magnesium-doped p-(Al,In)GaN layer by RPCVD in an environment, wherein the partial pressure of $N_2$ is greater than the partial pressure of $H_2$; and (ii) growing a second n-(Al,In)GaN layer on the first n-(Al,In)GaN layer by RPCVD in an environment wherein the partial pressure of $H_2$ is greater than the partial pressure of $N_2$.

Aspect 22. The method of aspect 21, wherein the first n-(Al,In)GaN layer has thickness less than 30 nm.

Aspect 23. The method of any one of aspects 21 to 22, wherein the first n-(Al,In)GaN layer has a thickness less than 10 nm.

Aspect 24. The method of any one of aspects 21 to 23, wherein the second n-(Al,In)GaN layer has a thickness greater than 10 nm.

Aspect 25. The method of any one of aspects 21 to 24, wherein (i) growing the first n-(Al,In)GaN layer comprises growing at a partial pressure of $N_2$ from 0.1 Torr to 10 Torr and a temperature from 500° C. to 1,050° C.

Aspect 26. The method of any one of aspects 21 to 25, wherein (ii) growing the second n-(Al,In)GaN layer comprises growing in the presence of $H_2$ and $NH_3$ at a partial pressure of $H_2$ from 0.1 Torr to 10 Torr and a temperature from 500° C. to 1,050° C.

Aspect 27. The method of any one of aspects 1 to 18, wherein (b) growing the n-(Al,In)GaN layer consists of: (i) growing a first n-(Al,In)GaN layer on the exposed magnesium-doped p-(Al,In)GaN layer by RPCVD in an environment, wherein the partial pressure of $N_2$ is greater than the partial pressure of $H_2$; and (ii) growing a second n-(Al,In)GaN layer on the first n-(Al,In)GaN layer by RPCVD in an environment wherein the partial pressure of $H_2$ is greater than the partial pressure of $N_2$.

Aspect 28. The method of aspect 27, wherein the thickness of the first n-(Al,In)GaN layer has a thickness less than 30 nm.

Aspect 29. The method of any one of aspects 27 to 28, wherein the first n-(Al,In)GaN layer has a thickness less than 10 nm.

Aspect 30. The method of any one of aspects 27 to 29, wherein the second n-(Al,In)GaN layer has a thickness greater than 10 nm.

Aspect 31. The method of any one of aspects 27 to 30, wherein (i) growing the first n-(Al,In)GaN layer comprises growing at a partial pressure of $N_2$ from 0.1 Torr to 10 Torr and a temperature from 500° C. to 1,050° C.

Aspect 32. The method of any one of aspects 27 to 31, wherein (ii) growing the second n-(Al,In)GaN layer comprises growing in the presence of $H_2$ and $NH_3$ at a partial pressure of $H_2$ from 0.1 Torr to 10 Torr and a temperature from 500° C. to 1,050° C.

Aspect 33. The method of any one of aspects 1 to 32, further comprising, after (b) growing the n-(Al,In)GaN layer; (c) growing one or more semiconductor layers overlying the n-(Al,In)GaN layer.

Aspect 34. The method of aspect 33, wherein (c) growing the one or more semiconductor layers comprises growing the one or more semiconductor layers in the presence of $H_2$ $NH_3$, or a combination thereof, at a temperature less than 1,050° C.

Aspect 35. The method of aspect 33, wherein (c) growing the one or more semiconductor layers comprises growing the one or more semiconductor layers in the presence of hydrogen at a temperature less than 1,050° C.

Aspect 36. The method of any one of aspects 33 to 35, wherein (c) growing the one or more semiconductor layers comprises growing by MOCVD.

Aspect 37. The method of any one of aspects 33 to 35, wherein (c) growing the one or more semiconductor layers comprises growing by RPCVD.

Aspect 38. The method of any one of aspects 33 to 37, wherein (c) growing the one or more semiconductor layers does not comprise passivating the activated p-(Al,In)GaN layer.

Aspect 39. The method of any one of aspects 1 to 38, wherein the buried activated p-(Al,In)GaN layer has a minimum dimension greater than 100 μm.

Aspect 40. The method of any one of aspects 1 to 39, wherein to the method does not comprise laterally activating the p-(Al,In)GaN layer.

Aspect 41. The method of any one of aspects 1 to 40, wherein the method does not comprise exposing the p-(Al,In)GaN layer to an environment in which the temperature is greater than 800° C. and the partial pressure of $H_2$ is less than 1 Torr.

Aspect 42. The method of any one of aspects 1 to 41, wherein the method does not comprise exposing the p-(Al,In)GaN layer to an environment capable of activating a passivated p-(Al,In)GaN layer.

Aspect 43. The method of any one of aspects 1 to 42, wherein the method does not comprise exposing the buried p-(Al,In)GaN layer to an activation step.

Aspect 44. A semiconductor device comprising a semiconductor structure fabricated by the method of any one of aspects 1 to 43.

Aspect 45. The semiconductor device of aspect 44, wherein the semiconductor device comprises a stacked optoelectronic structure.

Aspect 46. The semiconductor device of aspect 45, wherein the stacked optoelectronic structure comprises a stacked LED structure, a stacked laser diode structure, a multijunction solar cell, a stacked transistor, or a stacked power converter.

Aspect 47. The semiconductor device of any one of aspects 44 to 46, wherein the semiconductor device comprises an LED, a laser diode, a photovoltaic device, an optoelectronic device, a solar cell junction, a transistor, or a power converter.

Aspect 48. The semiconductor device of any one of aspects 44 to 46, wherein the semiconductor structure comprises a tunnel junction, an electrically conductive layer, or a combination thereof.

Aspect 49. An n/p-(Al,In)GaN tunnel junction comprising a semiconductor structure fabricated by the method of any one of aspects 1 to 43.

Aspect 50. The tunnel junction of aspect 49, wherein the n/p-(Al,In)GaN tunnel junction is characterized by a voltage drop across the n/p-(Al,In)GaN tunnel junction of less than 0.3 V at 10 A/cm$^2$.

Aspect 51. The tunnel junction of aspect 49, wherein the n/p-(Al,In)GaN tunnel junction is characterized by a voltage drop across the n/p-(Al,In)GaN tunnel junction of less than 0.1 V at 10 A/cm$^2$.

Aspect 52. A semiconductor device comprising the tunnel junction of any one of aspects 49 to 51.

Aspect 53. The semiconductor device of aspect 52, wherein the semiconductor device comprises a stacked optoelectronic structure.

Aspect 54. The semiconductor device of aspect 53, wherein the stacked optoelectronic structure comprises a stacked LED structure, a stacked laser diode structure, a multijunction solar cell, a stacked transistor, or a stacked power converter.

Aspect 55. The semiconductor device of aspect 54, wherein the semiconductor device comprises an LED, a laser diode, a photovoltaic device, an optoelectronic device, a solar cell junction, a transistor, or a power converter.

Aspect 1A. A method of fabricating a semiconductor structure comprising a buried activated p-(Al,In)GaN layer, comprising: (a) exposing a magnesium-doped p-(Al,In)GaN layer to a gaseous mixture comprising $H_2$, $NH_3$, or a combination thereof, wherein the gaseous mixture has a partial pressure of $H_2$ less than 760 Torr, to provide an exposed magnesium-doped p-(Al,In)GaN layer; and (b) growing an n-(Al,In)GaN layer on the exposed magnesium-doped p-(Al,In)GaN layer by RPCVD in an environment wherein the partial pressure of $H_2$ is greater than the partial pressure of $N_2$, to provide a semiconductor structure comprising a buried activated p-(Al,In)GaN layer.

Aspect 2A. A method of aspect 1A, wherein the method consists of steps (a) and (b).

Aspect 3A. The method of any one of aspects 1A to 2A, wherein in step (a) the gaseous mixture does not comprise $N_2$.

Aspect 4A. The method of any one of aspects 1A to 3A, wherein exposing comprises exposing the magnesium-doped p-(Al,In)GaN layer to a partial pressure of $H_2$ less than 300 Torr and to a temperature less than 900° C.

Aspect 5A. The method of any one of aspects 1A to 4A, wherein the magnesium-doped p-(Al,In)GaN layer comprises a concentration of the magnesium dopant from $1E19$ $cm^{-3}$ to $5E21$ $cm^{-3}$.

Aspect 6A. The method of any one of aspects 1A to 5A, wherein exposing the magnesium-doped p-(Al,In)GaN layer comprises exposing for less than 5 minutes.

Aspect 7A. The method of any one of aspects 1A to 6A, wherein in step (a) the partial pressure of $H_2$ is from 1 Torr to 300 Torr.

Aspect 8A. The method of any one of aspects 1A to 7A, wherein in step (b) the partial pressure of $H_2$ is from 0.1 Torr to 300 Torr.

Aspect 9A. The method of any one of aspects 1A to 8A, wherein exposing the magnesium-doped p-(Al,In)GaN layer comprises exposing to a $N_2$ plasma.

Aspect 10A. The method of any one of aspects 1A to 9A, wherein the magnesium-doped p-(Al,In)GaN layer is a passivated p-(Al,In)GaN layer.

Aspect 11A. The method of any one of aspects 1A to 9A, wherein the magnesium-doped p-(Al,In)GaN layer is an at least partially activated p-(Al,In)GaN layer.

Aspect 12A. The method of any one of aspects 1A to 11A, wherein (b) growing the n-(Al,In)GaN layer consists of growing an n-(Al,In)GaN layer on the exposed magnesium-doped p-(Al,In)GaN layer by RPCVD in an environment wherein the partial pressure of $H_2$ is greater than the partial pressure of $N_2$.

Aspect 13A. The method of any one of aspects 1A to 12A, wherein step (b) comprises: (b1) growing a first n-(Al,In)GaN layer on the exposed magnesium-doped p-(Al,In)GaN layer by RPCVD in an environment wherein the partial pressure of $N_2$ is greater than the partial pressure of $H_2$; and (b2) growing a second n-(Al,In)GaN layer on the first n-(Al,In)GaN layer by RPCVD in an environment wherein the partial pressure of $H_2$ is greater than the partial pressure of $N_2$.

Aspect 14A. The method of aspect 13A, wherein the method consists of steps (a), (b1), and (b2).

Aspect 15A. The method of any one of aspects 13A to 14A, wherein the first n-(Al,In)GaN layer has a thickness less than 30 nm.

Aspect 16A. The method of any one of aspects 13A to 15A, wherein the magnesium-doped p-(Al,In)GaN layer comprises a concentration of the magnesium dopant from $1E19$ $cm^{-3}$ to $5E21$ $cm^{-3}$.

Aspect 17A. The method of any one of aspects 13A to 16A, wherein in step (b1) the partial pressure of $N_2$ is from 0.1 Torr to 300 Torr.

Aspect 18A. The method of any one of aspects 13A to 17A, wherein in step (b1) the partial pressure of $N_2$ is from 0.1 Torr to 10 Torr and the temperature is from 500° C. to 1,050° C.

Aspect 19A. The method of any one of aspects 13A to 18A, wherein in step (b2) growing the second n-(Al,In)GaN layer comprises growing in the presence of $H_2$ and $NH_3$ at a partial pressure of $H_2$ from 0.1 Torr to 10 Torr and a temperature from 500° C. to 1,050° C.

Aspect 20A. The method of any one of aspects 1A to 19A, further comprising, after (b) growing the n-(Al,In)GaN layer; (c) growing one or more semiconductor layers overlying the n-(Al,In)GaN layer.

Aspect 21A. The method of aspect 20A, wherein (c) growing the one or more semiconductor layers comprises growing the one or more semiconductor layers in the presence of $H_2$ $NH_3$, or a combination thereof, at a temperature less than 1,050° C.

Aspect 22A. The method of any one of aspects 1A to 21A, wherein the buried activated p-(Al,In)GaN layer has a minimum lateral dimension greater than 100 μm.

Aspect 23A. The method of any one of aspects 1A to 22A, wherein a n/p-(Al,In)GaN tunnel junction incorporating the buried activated p-(Al,In)GaN layer is characterized by a voltage drop across the n/p-(Al,In)GaN tunnel junction of less than 0.3 V at 10 $A/cm^2$.

Aspect 24A. A semiconductor device comprising a semiconductor structure fabricated by the method of any one of aspects 1A to 23A.

Aspect 25A. The semiconductor device of aspect 24A, wherein the semiconductor device comprises a stacked optoelectronic structure, an LED, a laser diode, a photovoltaic device, an optoelectronic device, a solar cell junction, a transistor, or a power converter.

Aspect 26A. An n/p-(Al,In)GaN tunnel junction comprising a semiconductor structure fabricated by the method of any one of aspects 1A to 25A.

Aspect 27A. A semiconductor device comprising the tunnel junction of claim 26A.

Aspect 28A. The semiconductor device of claim 27A, wherein the semiconductor device comprises a stacked optoelectronic structure.

Aspect 29A. The semiconductor device of claim 28A, wherein the stacked optoelectronic structure comprises a stacked LED structure, a stacked laser diode structure, a multijunction solar cell, a stacked transistor, or a stacked power converter.

EXAMPLES

Embodiments provided by the present disclosure are further illustrated by reference to the following examples, which describe semiconductors, semiconductor devices, and methods provided by the present disclosure. It will be apparent to those skilled in the art that many modifications, both to materials, and methods, may be practiced without departing from the scope of the disclosure.

Example 1

General Approach

The RPCVD layers described herein are generally grown with a lower relative growth rate and at lower temperatures (compared with e.g., MOCVD) and under nitrogen plasma. The growth environment can be a mixture of hydrogen, nitrogen and other gases but with (i) predominantly $NH_3$, or (ii) predominantly $H_2$, and or (iii) a mixture of predominantly $NH_3$ and $H_2$. Further details are provided below.

Example 2

The following experiment was designed to demonstrate the use of RPCVD for growing a buried but activated p-GaN layer for a Tunnel Junction (TJ) application. The TJ structures were grown on commercially-obtained, MOCVD-grown blue LEDs on 2-inch patterned sapphire substrates using both RPCVD and MOCVD (forming the three structures as shown in FIGS. 3A-3C and FIGS. 4A-4C representing, respectively, the structures with and without an InGaN cap). Such MOCVD-grown blue LEDs may be obtained from a number of commercial sources including Veeco, AMEC, Lumileds and the like.

The final devices were measured using on-wafer electroluminescence (EL) quick test methods. The n-contact was made by scribing through the layers to expose the lower n-GaN layer and filling with indium-tin solder. The top contact was made using an indium sphere and annealed on a hot plate for 10 sec. A gentle square scribe (2 mm×2 mm) was made surrounding the top contact to isolate the contacts, such that the only electrical connection between the top and bottom contacts was via the lower n-GaN layer. This prevented current from conducting laterally between the two contacts via the top n-GaN layers.

The EL measurements were made by sweeping the forward bias current from 0 mA to 500 mA and recording the light output power (LOP) using a power meter located underneath the substrate. The EL was compared for the structures grown by MOCVD and RPCVD and also against the original source wafer. The contacts for the original source wafer were prepared in the same way as for the TJ structures.

The commercial LEDs were available with two different terminations. The first was terminated with a highly doped $(p^{++})$ GaN:Mg layer (as is typically used in the industry). The second had an additional 1 nm-thick InGaN:Si contact layer to improve the contact resistance of the bare LED (as is typically used for an ITO contact in the industry). For completeness, the TJ overgrowths were tested on both structures (with and without the n-InGaN contact layer).

The results of the testing are shown graphically in FIGS. 5A-5D (results for the structures of FIGS. 3A-3C) and FIGS. 6A-6D (results for the structures of FIGS. 4A-4C) and Table 1 and Table 2 present the data for the structures of FIGS. 3A-3C and FIGS. 4A-4C, respectively. The text colours in the table correspond to the colour of the line traces in the graphs of FIGS. 5A-5D and FIGS. 6A-6D.

TABLE 1

Figure 3A:
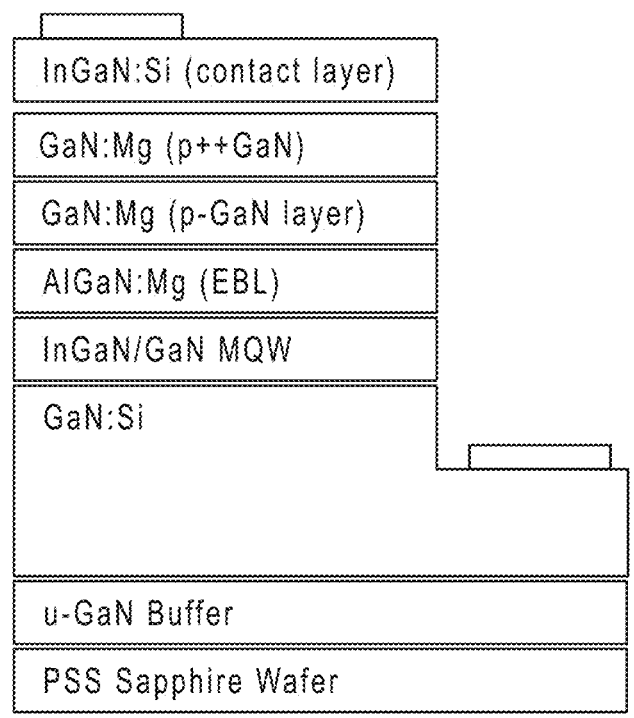
FIGS. 3A-3C show schematic representations of a number of semiconductor structures, employing an n-InGaN cap, which were tested using electroluminescent methods to demonstrate the advantages of the approach of the present invention.
Figure 3B:
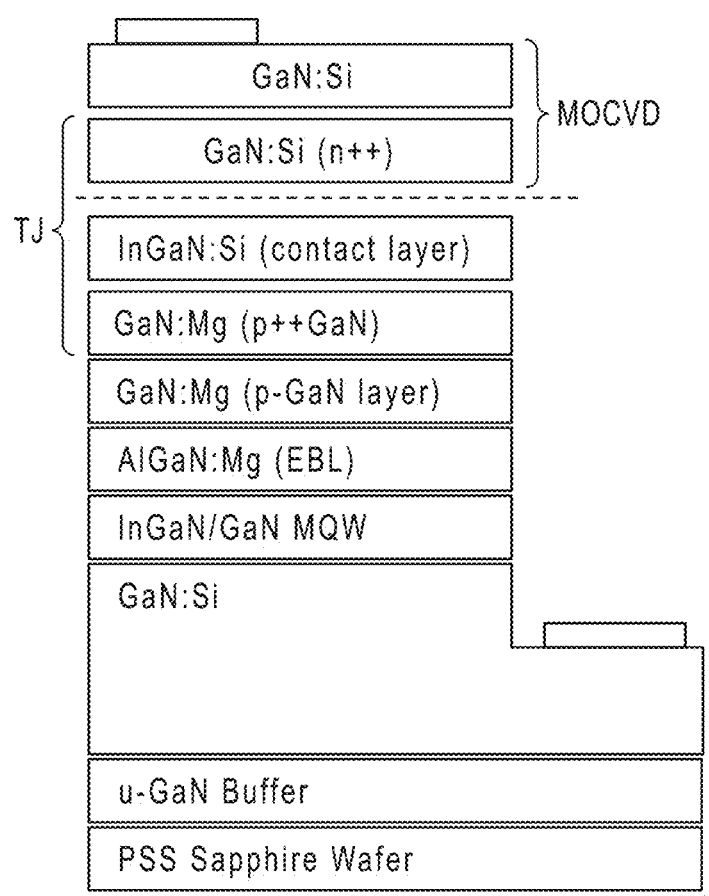
Figure 3C:
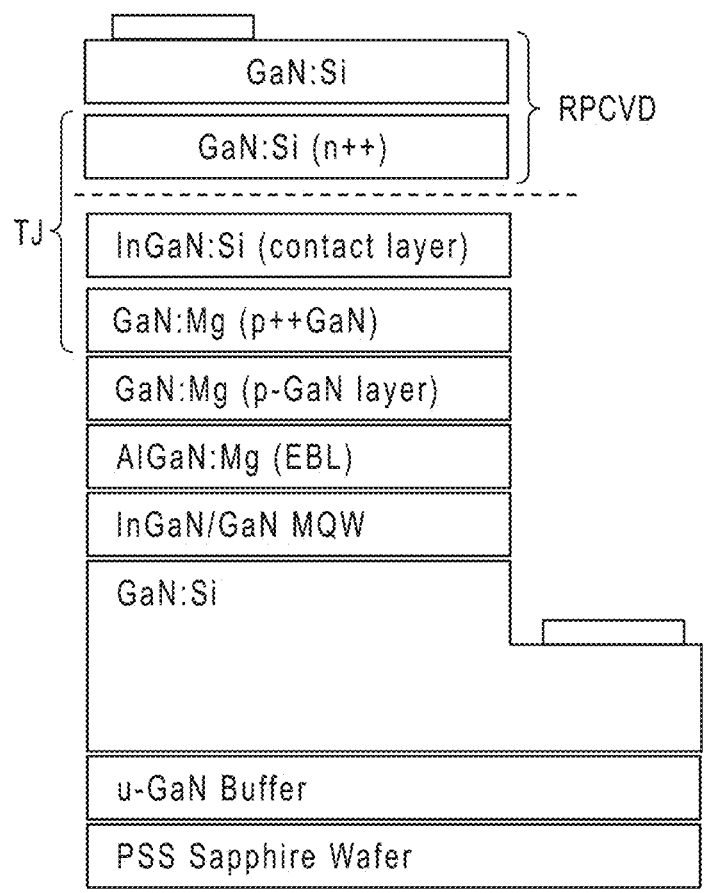

EL data for the structures of FIGS. 3A-3C.

| Wafer No. (on PSS) | EL @ (20 mA) | | | | | | EL @ 200 mA | | | | | |
|---|---|---|---|---|---|---|---|---|---|---|---|---|
| | Vf (V) | LOP (mW) | Peak (nm) | FWHM (nm) | WPE (%) | EQE (%) | Vf (V) | LOP (mW) | Peak (nm) | FWHM (nm) | WPE (%) | EQE (%) |
| MOCVD blue LED[1] (activated) | 3.3 | 4.14 | 457 | 16.3 | 6.35 | 7.63 | 5.6 | 39.76 | 457 | 19.1 | 3.55 | 7.31 |
| RPCVD InGaN TJ on LED | 2.8 | 3.74 | 462 | 15.5 | 6.59 | 6.95 | 4.9 | 41.34 | 461 | 17.3 | 4.27 | 7.66 |
| MOCVD InGaN TJ on LED | 6.7 | 3.90 | 458 | 17.3 | 2.91 | 7.20 | 11.2 | 34.94 | 458 | 23.1 | 1.56 | 6.43 |

[1]The MOCVD-grown blue LED reference did not have a top ITO layer.

TABLE 2

Figure 4A:
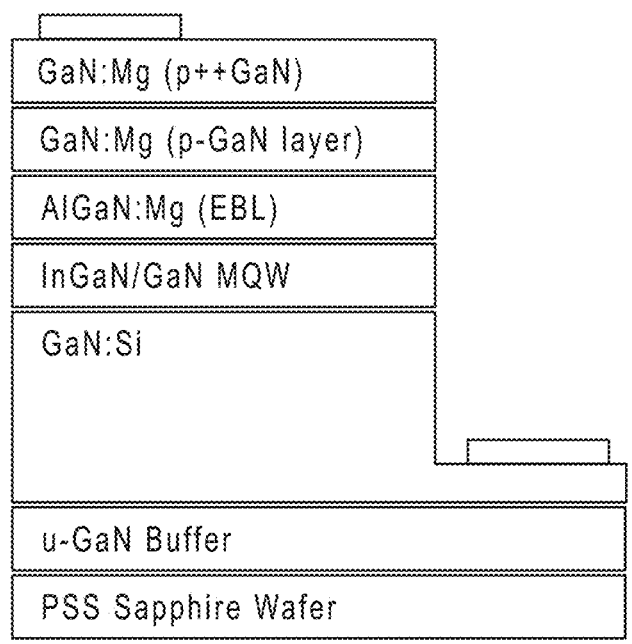
FIGS. 4A-4C show schematic representations of a number of semiconductor structures, without an n-InGaN cap, which were tested using electroluminescent methods to demonstrate the advantages of the approach of the present invention 3.
Figure 4B:
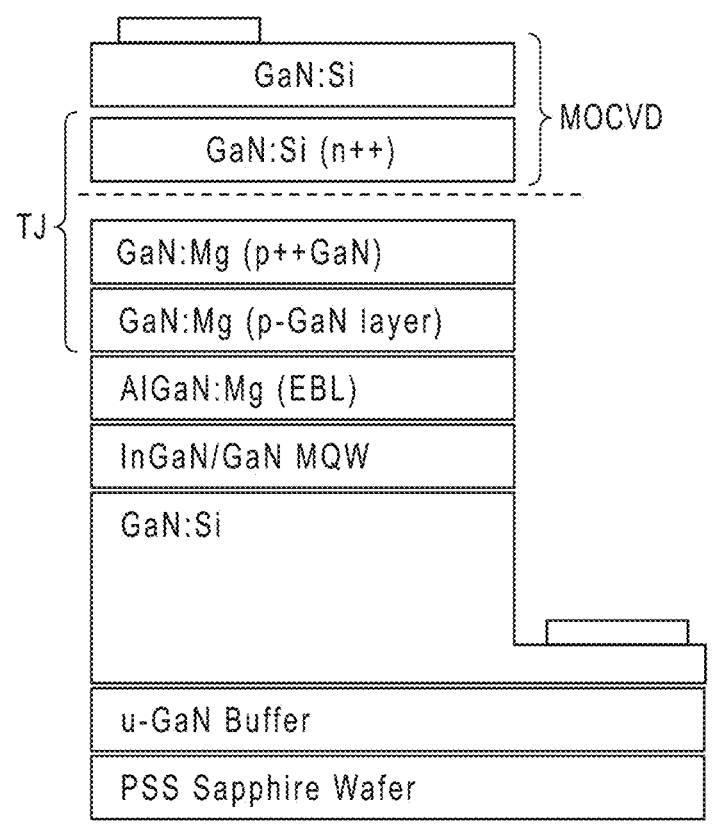
Figure 4C:
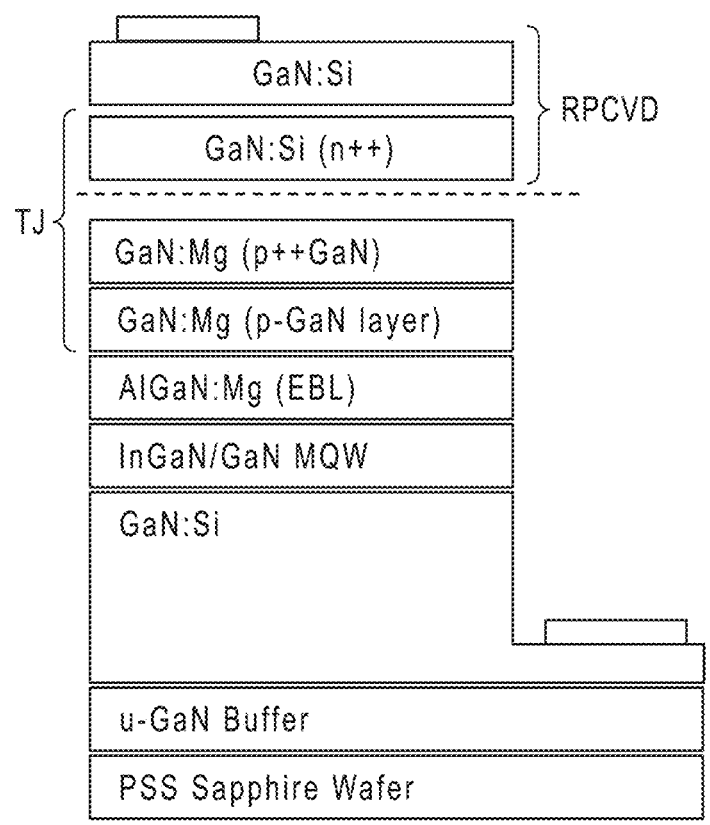
Figure 5A:
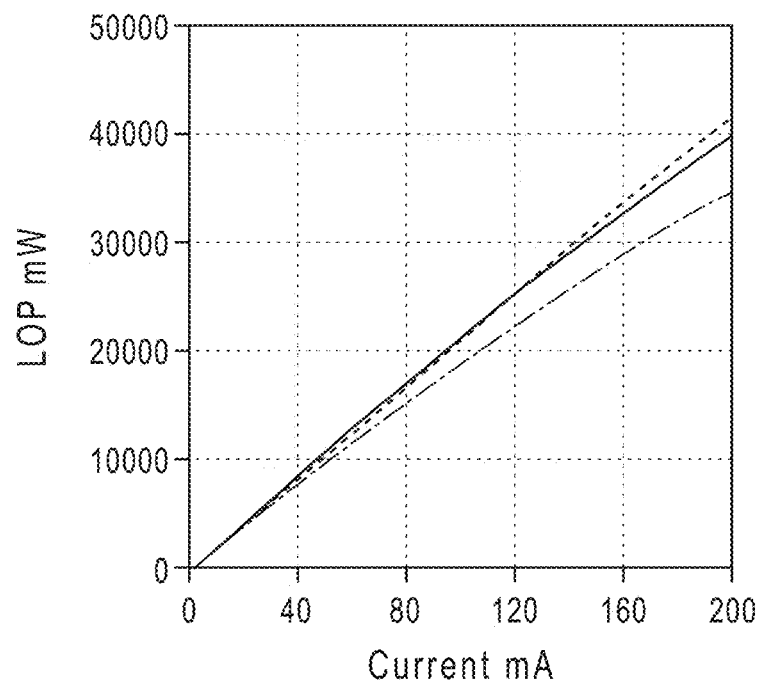
FIGS. 5A-5D show graphical representations of results of the testing of the structures represented in FIGS. 3A-3C, having an n-InGaN cap, wherein the solid lines relate to the MOCVD grown blue LED of the structure shown in FIG. 3A, the broken lines relate to the MOCVD completed structure shown in FIG. 3B and the dashed lines relate to the RPCVD completed structure shown in FIG. 3C.
Figure 5B:
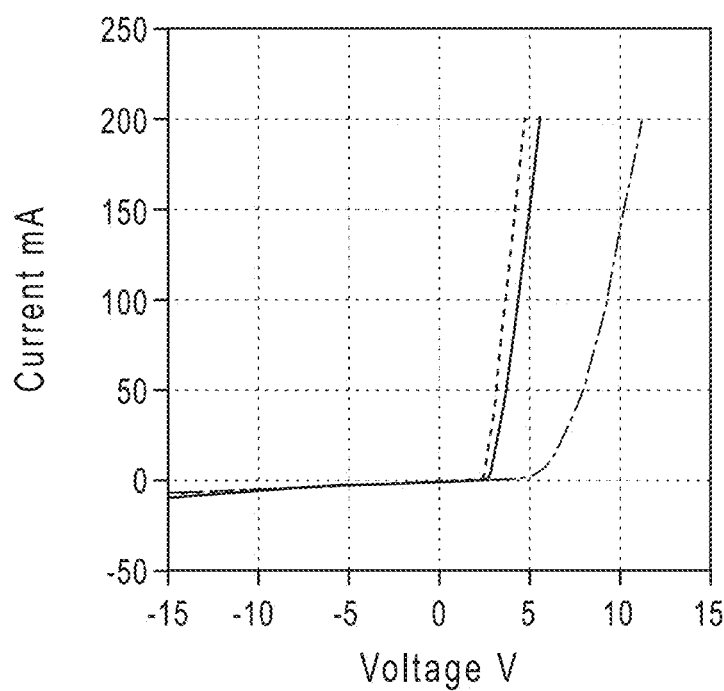
Figure 5C:
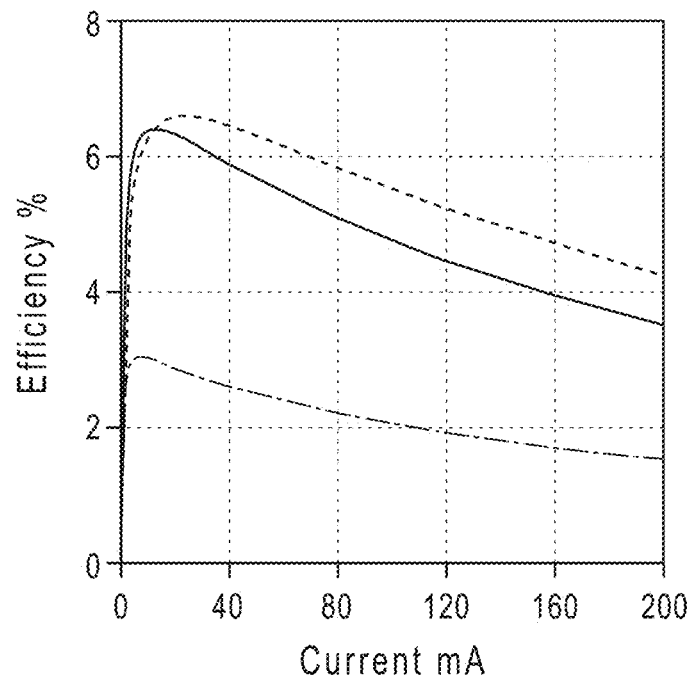
Figure 5D:
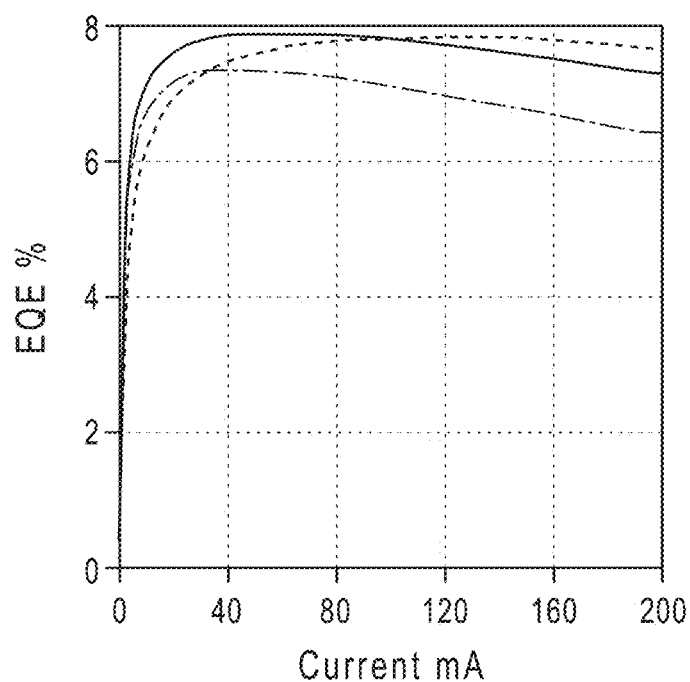
Figure 6A:
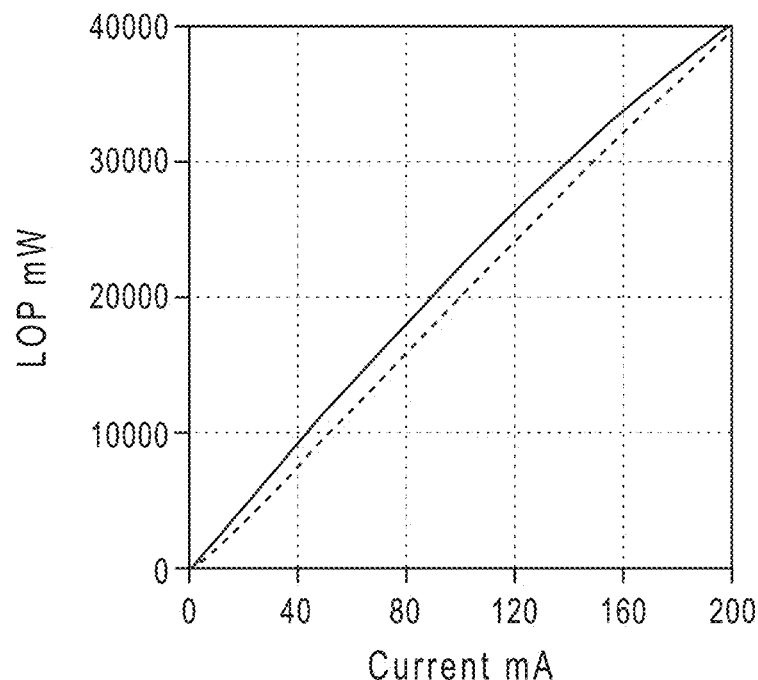
FIGS. 6A-6D show graphical representations of the results of the testing of the structures represented in FIGS. 4A-4C, without an n-InGaN cap, wherein the solid lines relate to the MOCVD grown blue LED of the structure shown in FIG. 4A and the dashed relate to the RPCVD completed structure shown in FIG. 4C.
Figure 6B:
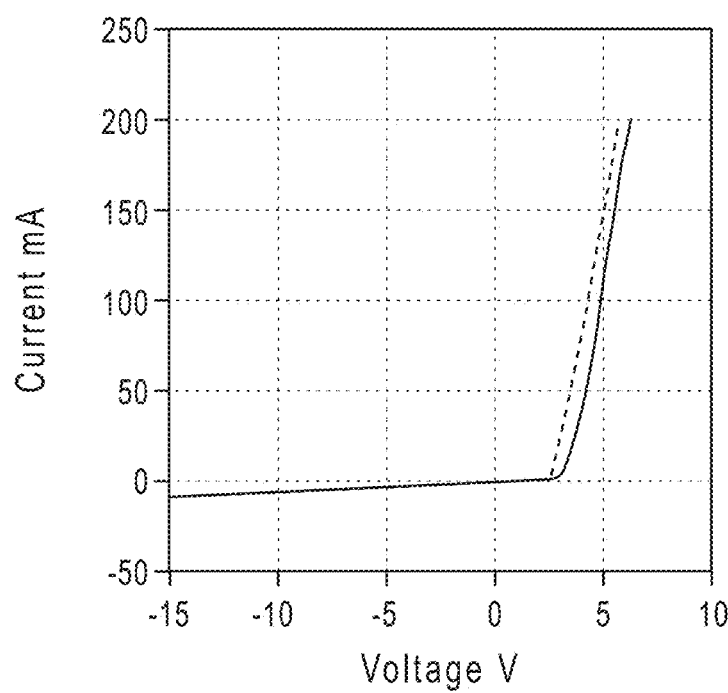
Figure 6C:
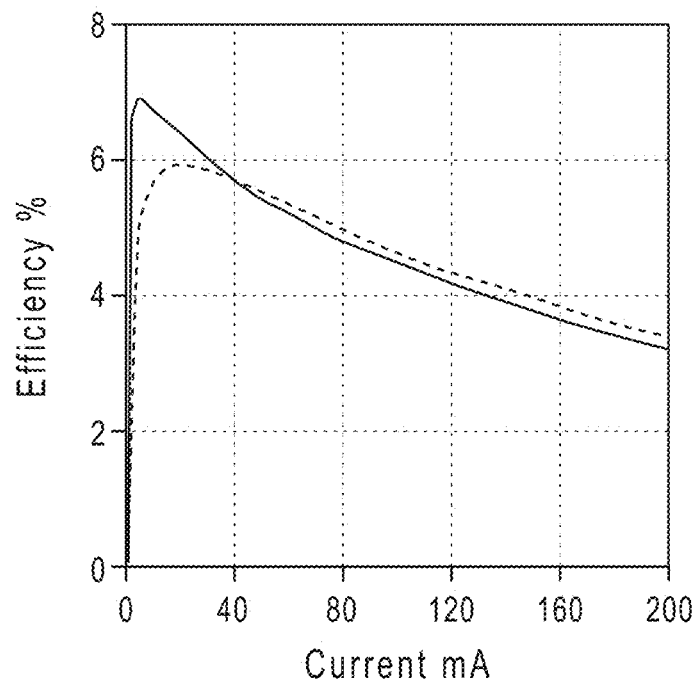
Figure 6D:
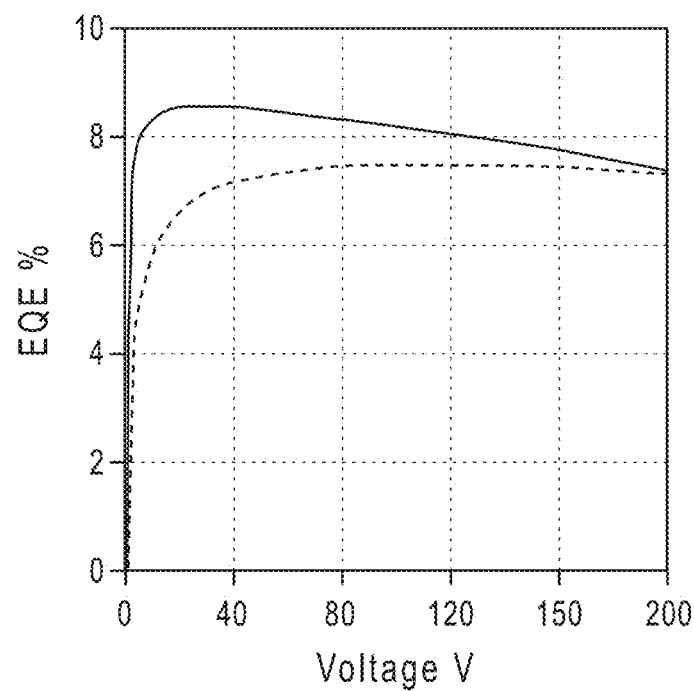

EL data for the structures of FIGS. 4A-4C.

| Wafer No. (on PSS) | EL @ (20 mA) | | | | | | EL @ (200 mA) | | | | | |
|---|---|---|---|---|---|---|---|---|---|---|---|---|
| | Vf (V) | LOP (mW) | Peak (nm) | FWHM (nm) | WPE (%) | EQE (%) | Vf (V) | LOP (mW) | Peak (nm) | FWHM (nm) | WPE (%) | EQE (%) |
| MOCVD blue LED (activated) | 3.6 | 4.62 | 459 | 17.5 | 6.40 | 8.55 | 6.2 | 39.87 | 460 | 22.1 | 3.23 | 7.38 |
| RPCVD InGaN TJ on LED | 3.0 | 3.57 | 463 | 16.3 | 5.96 | 6.65 | 5.7 | 39.42 | 462 | 18.8 | 3.43 | 7.32 |
| MOCVD InGaN TJ on LED | | | | | No device performance[1] | | | | | | | |

[1]No LOP over the applied voltage range.

The results shown in FIGS. 5A-5D and FIGS. 6A-6D, and in Tables 1 and 2, indicate that the TJ structure grown under RPCVD conditions according to the present invention (Structure 3 in each experiment) displays comparable LOP compared to the bare LED (Structure 1) and also displays low comparable Vf. The comparable LOP indicates a sufficient number of holes were injected into the active region for recombination while the low Vf indicates the voltage drop across the TJ and the voltage drop across the buried p-GaN layer is small. Both of these observations indicate that the buried p-GaN layer remained fully activated during the TJ growth.

FIGS. 5A-5D show graphical representations of the results of the testing of the structures represented in FIGS. 3A-3C, having an n-InGaN cap, wherein the solid lines relate to the MOCVD grown blue LED of the structure shown in FIG. 3A, the broken lines relate to the MOCVD completed structure shown in FIG. 3B and the dashed lines relate to the RPCVD completed structure shown in FIG. 3C.

FIGS. 6A-6D show graphical representations of the results of the testing of the structures represented in FIGS. 4A-4C, without an n-InGaN cap, wherein the solid lines relate to the MOCVD grown blue LED of the structure shown in FIG. 4A and the dashed relate to the RPCVD completed structure shown in FIG. 4C.

In contrast, the TJ structure grown solely by MOCVD (Structure 2 in each experiment) can be seen, in FIGS. 5A-5D and Table 1, to display higher Vf and lower LOP indicating poor hole injection efficiency and high series resistance which are associated with a passivated or partially passivated buried p-GaN layer. Further, the LOP and Vf was unstable during measurements which is typical of LED devices with passivated or partially passivated p-GaN layers.

The RPCVD TJ structure displays good LOP and Vf compared to the bare LED (structure 1) for both experiments with and without the n-InGaN contact layer. The MOCVD grown TJ was only tested on the structure without the n-InGaN layer.

Example 3

Figure 7:
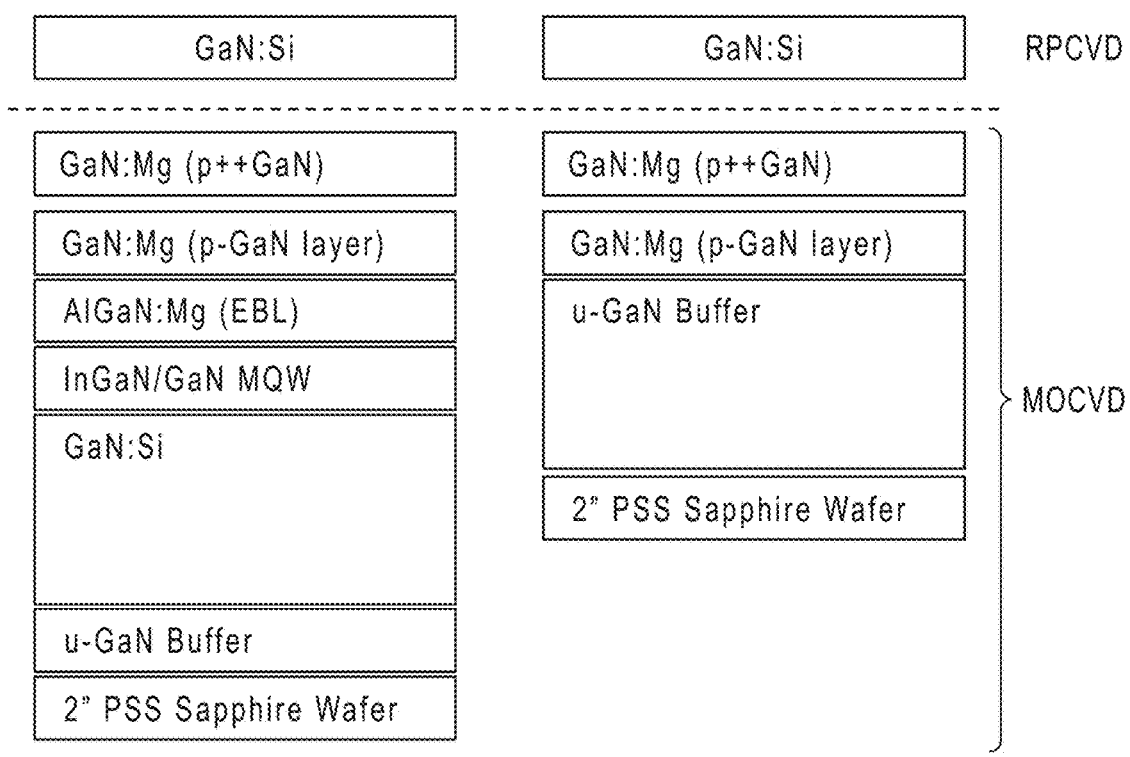
FIG. 7 shows representative structures grown according to methods of the present invention.

The structures shown in FIG. 7 are examples of a single RPCVD n-GaN layer overgrown on an MOCVD-grown p-GaN layer such that the p-GaN layer becomes and/or remains activated at the end of the growth. The first structure (on the left) represents overgrowth on a complete MOCVD LED. The second structure (on the right) represents overgrowth on a simplified structure containing only the buffer layers and the p-GaN layers (no active region). The process conditions used for growth of these structures formed by methods provided by the present disclosure are provided in Table 3.

TABLE 3

Process conditions for the testing of the structures in FIG. 7.
RPCVD n-GaN Process Conditions

| Parameter | Range | Condition |
| --- | --- | --- |
| Pressure (Torr) | 1-10 | 4.75 |
| Temperature (° C.) | 650-900 | 800 |
| $N_2$ Flow (sccm)[1] | 0-6000 | 3200 |
| $H_2$ Flow (sccm) | 0-25000 | 2300 |
| $NH_3$ Flow (sccm) | 0-5000 | 600 |
| Plasma RF Power (kW) | 4-12 | 9.7 |
| Plasma $N_2$ Flow (sccm)[1] | 3000-12000 | 6700 |

[1]$N_2$ flow excludes $N_2$ plasma flow.

The present invention provides a number of significant benefits due to the use of a hybrid MOCVD/RPCVD growth approach. Particularly, the use of RPCVD allows high carrier concentrations and high carrier mobility to be achieved in the as-grown doped semiconductor layers at temperatures which are not damaging to potentially temperature sensitive layers, such as indium-containing active layers. A sharp magnesium profile can also be achieved at tunnel junctions grown under RPCVD conditions due to low dopant diffusion achieved at the low growth temperatures, as compared with MOCVD growth. Finally, this approach allows for buried p-type semiconductor layers to be in an activated state and to remain this way, due to n-type layer RPCVD overgrowth, even if subsequent structures are to be grown under MOCVD hydrogen-rich conditions.

Example 4

Performance of a Commercial LED with an Overlying n-p GaN Tunnel Junction

The quality of buried activated p-GaN layers fabricated according to methods provided by the present disclosure was determined by growing n/p-GaN tunnel junctions and measuring the device performance.

Figure 8:
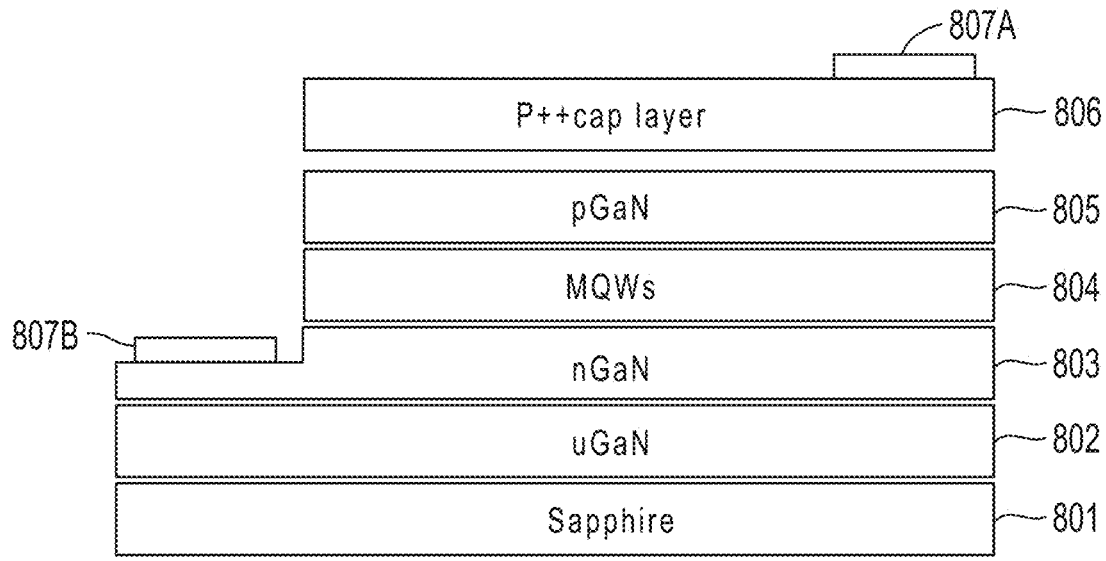
FIG. 8 shows an example of a semiconductor structure of a commercial LED.
Figure 9:
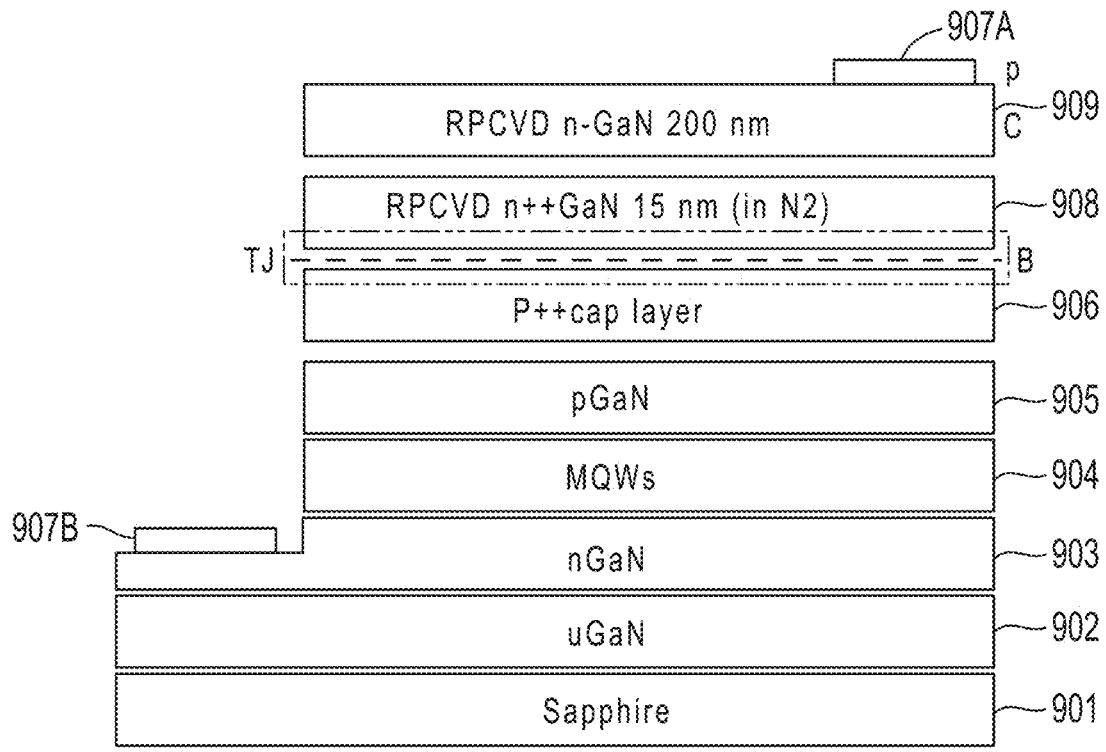
FIG. 9 shows an example of a semiconductor structure of a commercial LED with an overlying buried activated n/p-GaN tunnel junction provided by the present disclosure.

FIG. 8 and FIG. 9 show device structures used to evaluate the performance of n/p-(Al,In)GaN tunnel junctions and buried activated p-(Al,In)GaN layers fabricated using methods provided by the present disclosure.

FIG. 8 shows a cross-sectional view of a commercial blue MQW LED including sapphire substrate 801, u-GaN layer 802, n-GaN layer 803, multi-quantum well layer 804, p-GaN layer 805, and $p^{++}$-GaN cap layer 806. Electrical contacts 807A and 807B are interconnected to the n-GaN layer 803 and to the $p^{++}$-GaN cap layer 806, respectively.

FIG. 9 shows a cross-sectional view of a device structure that includes the commercial MQW LED structure of FIG. 8, and which was overgrown with a 15 nm-thick $n^{++}$-GaN layer and a 200 nm-thick n-GaN layer to form a tunnel junction B. Before growing the n-doped GaN layers, the $p^{++}$-GaN layer was exposed to a $NH_3$:$H_2$ environment followed by a $N_2$ plasma according to methods provided by the present disclosure, and the n-doped GaN layers were then grown under RPCVD conditions.

FIG. 9 shows the layers of the commercial blue MQW LED including sapphire substrate 901, u-GaN layer 902, n-GaN layer 903, multi-quantum well layer 904, p-GaN layer 905, and $p^{++}$-GaN cap layer 906. A 15 nm-thick RP-CVD-grown $n^{++}$-GaN layer 908 overlies the $p^{++}$-GaN layer and a 200 nm-thick RP-CVD grown n-GaN layer 909 overlies the $n^{++}$-GaN layer 908. Electrical contacts 907A and 907B are interconnected to the buried n-GaN layer 903 and to uppermost n-GaN layer 909, respectively.

The device structures shown in FIGS. 8 and 9 include identical layers up to the top $p^{++}$-GaN layer, and therefore any differences in the device performance can be attributed to the layers above the $p^{++}$-GaN layer.

Ideally one would like to measure the performance of the entire LED structure. However, this requires that an ohmic contact be made to the $p^{++}$-GaN surface, which is difficult to accomplish and is expected to result in a non-insignificant contact resistance. On the other hand, measuring the properties of the tunnel junction directly requires that an ohmic contact be made to the uppermost n-GaN surface, which is typically easier and less likely to contribute to a significant contact resistance, and also minimizes the number of device processing steps.

Nevertheless, if the Vf and light output (LOP) of the device with the n/p-GaN tunnel junction are as good as or better than the Vf and LOP of the same LED device without the n/p-GaN tunnel junction, then it can be inferred that the buried p-GaN layer must be active. The converse, however, is not necessarily true. A tunnel junction that displays poor Vf and LOP may be the result of a passivated p-GaN layer and/or may be due to a poor quality n/p-GaN tunnel junction with a low tunnelling probability.

Figure 10:
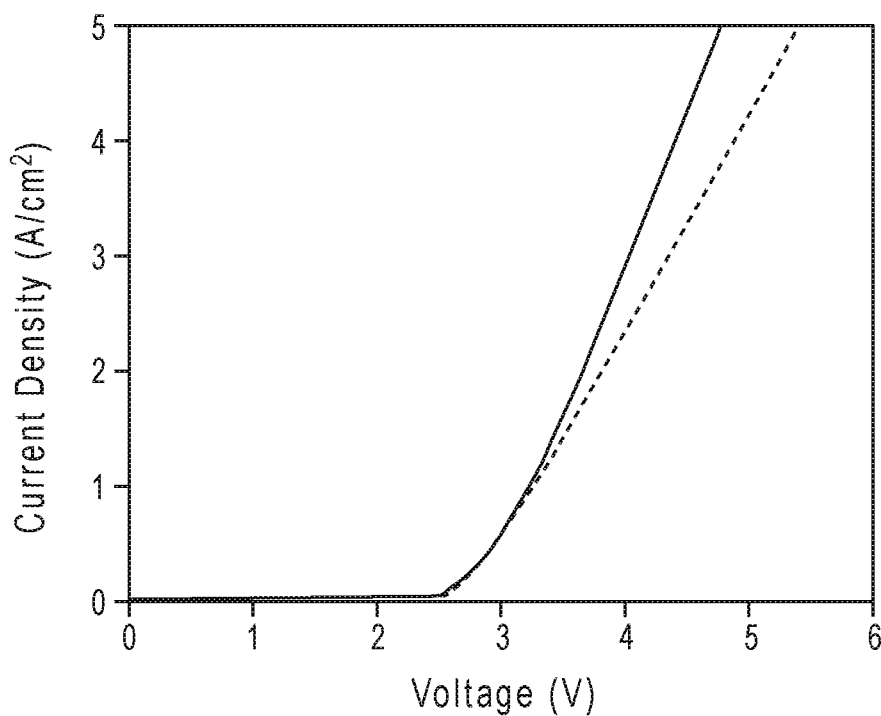
FIG. 10 shows an IV curve for the n/p-GaN tunnel junction shown in FIG. 9.

FIG. 10 shows an IV curve for the devices shown in FIGS. 8 and 9. The LED having a tunnel junction exhibited a voltage of 4.75 V at a current density of 5 A/cm$^2$ compared to a voltage of 5.35 V at a current density of 5 A/cm$^2$ for the commercial LED without the overlying n/p-GaN tunnel junction. This result indicates that the buried p-GaN layer is activated.

Experiment 5

Effect of Pre-Growth Treatment Conditions on the Performance of a Commercial MQW LED with an Overlying n/p-GaN Tunnel Junction The effect of various pre-growth treatment conditions was evaluated using the semiconductor structures shown in FIG. 8 and FIG. 9.

Starting with a commercial blue MQW LED as described in Example 4, the uppermost p$^{++}$-GaN layer was first exposed under various conditions.

Figure 11:
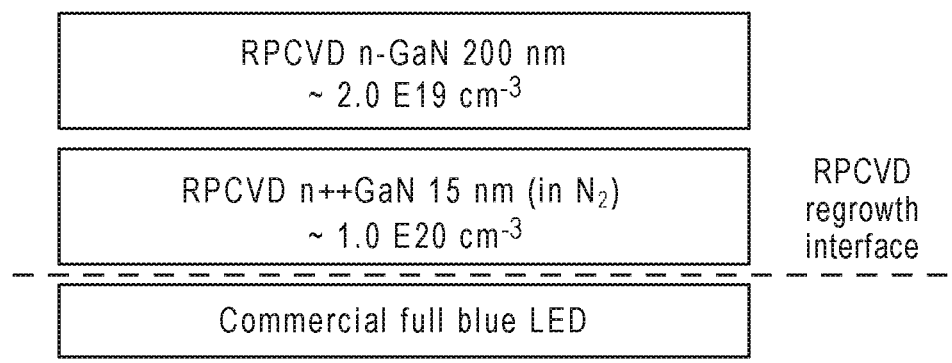
FIG. 11 shows a schematic of an example of a buried activated n/p-GaN tunnel junction provided by the present disclosure.

A 15 nm-thick n$^{++}$-GaN layer (dopant concentration ~1.0E20 cm$^{-3}$) was grown over the exposed p$^{++}$-GaN layer by RPCVD under the indicated process conditions. To complete the n/p-GaN tunnel junction, a 50 nm-thick n-GaN layer (dopant concentration about 2.0E19 cm$^{-3}$) was grown over the n$^{++}$-GaN layer, also by RPCVD under the indicated process conditions. The structure of the overlying n$^{++}$/n-GaN layers is shown in FIG. 11.

The process conditions used to fabricate the n/p-GaN tunnel junctions are shown in FIG. 17 (Table 4). FIG. 17 (Table 4) also shows the LOP, Vf, and the change in the Vf ($\Delta V_f$) compared to the respective LED without the overlying n/p-GaN tunnel junction.

The full commercial LED had an ITO layer over the p$^+$-GaN layer.

Figure 12A:
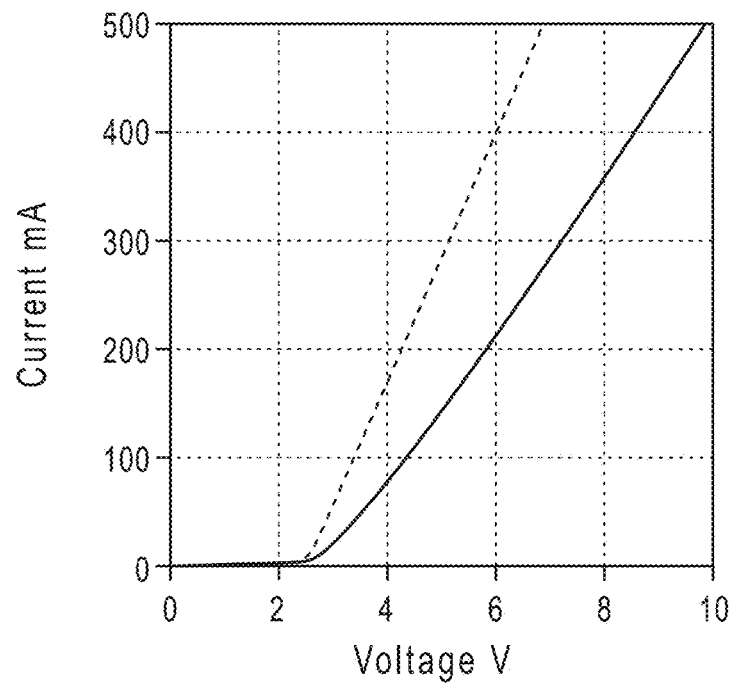
FIG. 12A shows IV curves for commercial full LEDs having an ITO layer including exposure of a p-GaN layer to a $NH_3$:$N_2$ environment and overgrowth of an $n^{++}$/n-GaN layer using RPCVD.

FIG. 12A shows IV curves for a full commercial MQW LED (dashed line) with an ITO layer and a MQW LED with a TJ (solid line). Before growing the n$^{++}$- and n-GaN layers, the uppermost p-GaN layer of the LED was exposed to NH$_3$ and N$_2$.

Figure 12B:
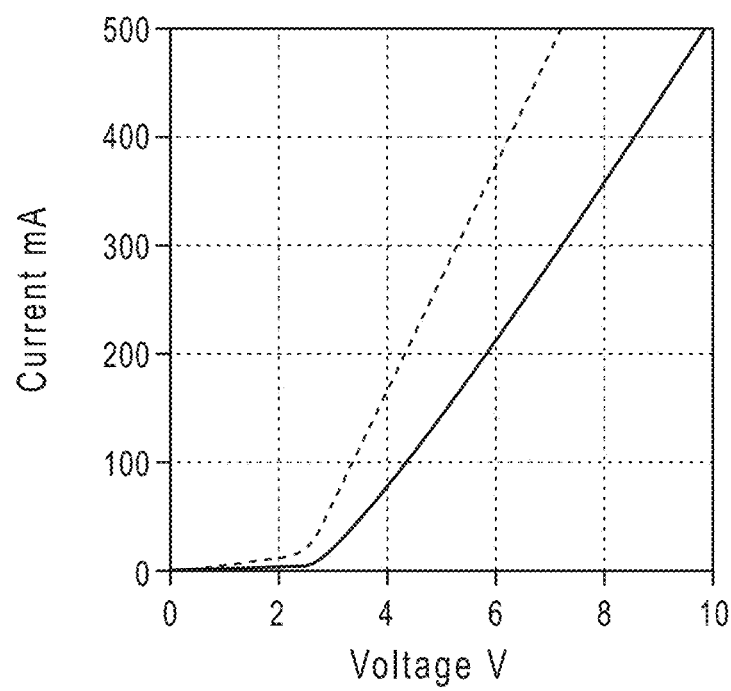
FIG. 12B shows IV curves for 1TS p-GaN on a commercial partial LED having an ITO layer including exposure of a p-GaN layer to a $NH_3$:$N_2$ environment and overgrowth of an $n^{++}$/n-GaN layer using RPCVD.

FIG. 12B shows IV curves for a partial MQW LED with p$^+$/p-GaN layers grown by MOCVD grown over the uppermost LED layer before (dashed line) and after (solid line) deposition of n$^{++}$/n-GaN layers. Before growing the n$^{++}$/n-GaN layers, the uppermost p-GaN layer was exposed to NH$_3$ and N$_2$. The process conditions and performance characteristics are shown in FIG. 17 (Table 4) and correspond to Process conditions A.

Figure 13A:
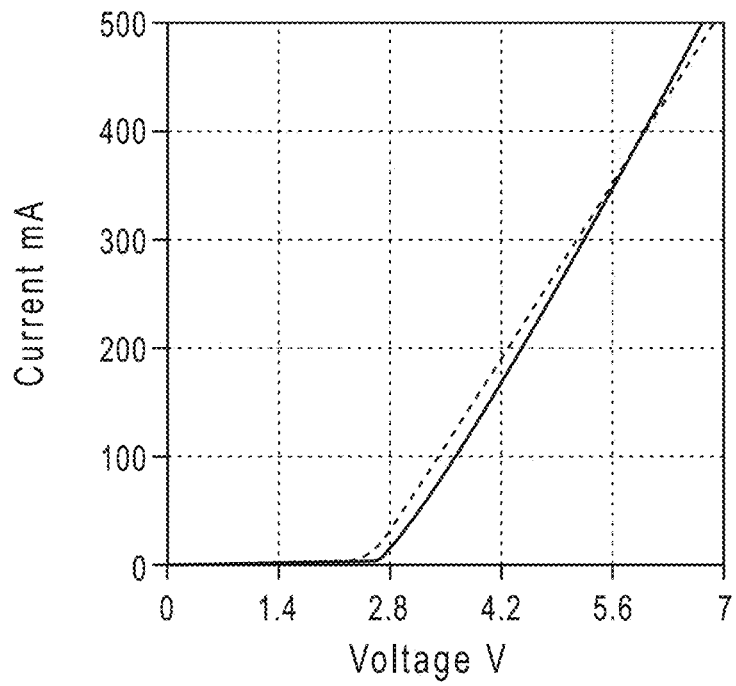
FIG. 13A shows IV curves for commercial full LEDs having an ITO layer including exposure of a p-GaN layer to a $NH_3$:$H_2$ environment and overgrowth of an $n^{++}$/n-GaN layer using RPCVD.

FIG. 13A shows IV curves for commercial full LEDs including exposure of the p-GaN layer to a NH$_3$:H$_2$ environment and overgrowth of an n$^{++}$/n-GaN layer using RPCVD.

Figure 13B:
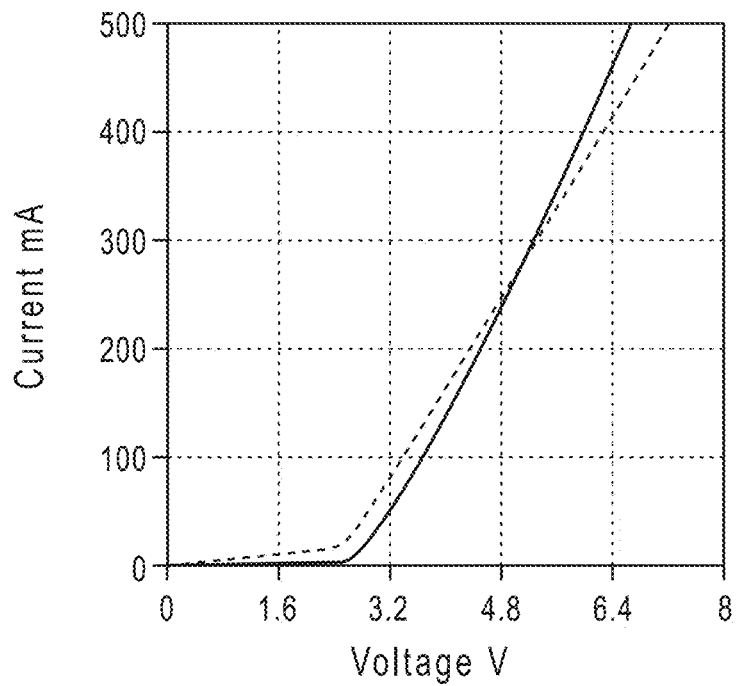
FIG. 13B shows IV curves for 1TS p-GaN on a commercial partial LED having an ITO layer including exposure of a p-GaN layer to a $NH_3$:$H_2$ environment and overgrowth of an $n^{++}$/n-GaN layer using RPCVD.

FIG. 13B shows IV curves for 1TS p-GaN on a commercial partial LED including exposure of the p-GaN layer to a NH$_3$:H$_2$ environment and overgrowth of an n$^{++}$/n-GaN layer using RPCVD. The process conditions and performance characteristics are shown in FIG. 17 (Table 4) and correspond to Process conditions B.

Figure 14A:
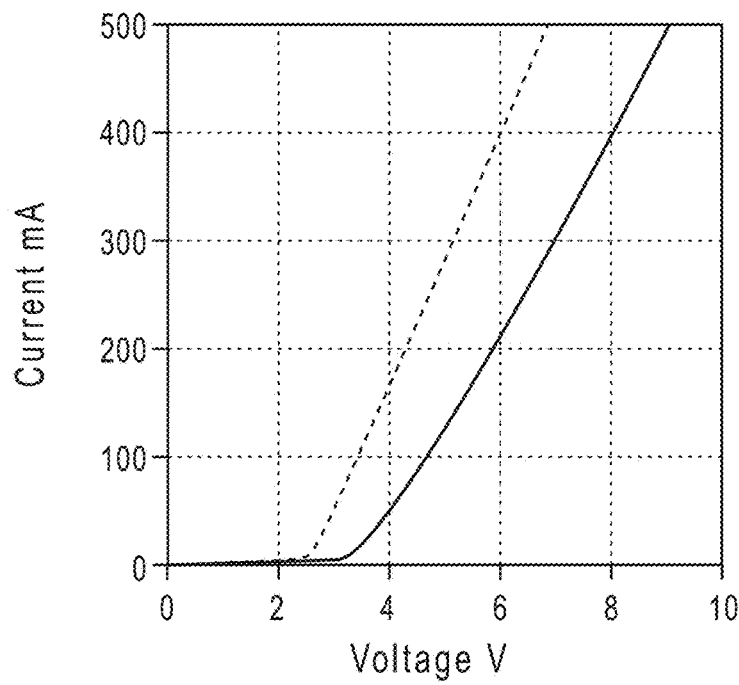
FIG. 14A shows IV curves for commercial full LEDs having an ITO layer including exposure of a p-GaN layer to a $N_2$ environment and overgrowth of an $n^{++}$/n-GaN layer using RPCVD.

FIG. 14A shows IV curves for commercial full LEDs including exposure of the p-GaN layer to a N$_2$ environment and overgrowth of an n$^{++}$/n-GaN layer using RPCVD.

Figure 14B:
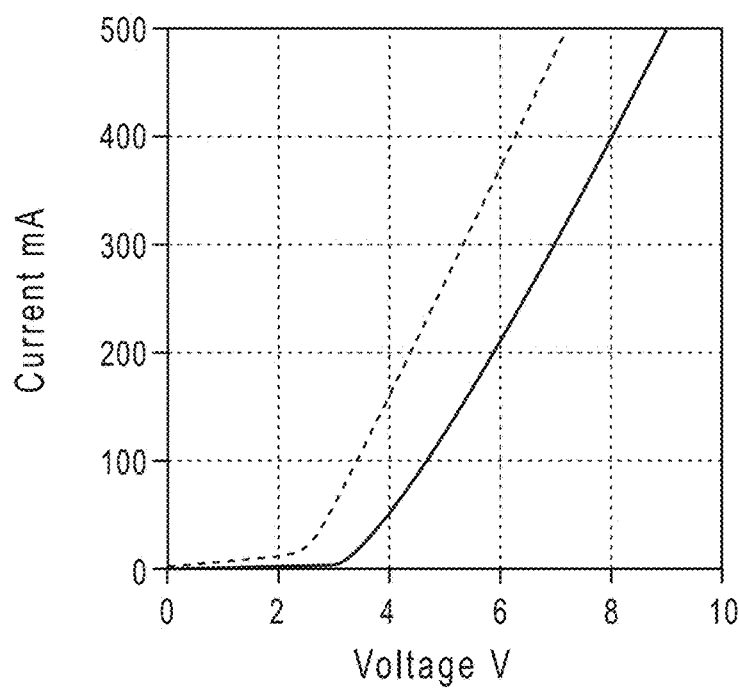
FIG. 14B shows IV curves for 1TS p-GaN on a commercial partial LED having an ITO layer including exposure of a p-GaN layer to a $N_2$ environment and overgrowth of an $n^{++}$/n-GaN layer using RPCVD.

FIG. 14B shows IV curves for 1TS p-GaN on a commercial partial LED including exposure of the p-GaN layer to a N$_2$ environment and overgrowth of an n$^{++}$/n-GaN layer using RPCVD. The process conditions and performance characteristics are shown in FIG. 17 (Table 4) and correspond to Process conditions C.

The results shown in FIGS. 13A and 13B demonstrate that exposure to NH$_3$ and H$_2$ environment performed better that the MQW LED at higher currents thereby confirming that the underlying buried p-GaN layer was activated and that even when grown under MOCVD conditions expected to produce a passivated p-GaN layer, a high-quality buried activated p-GaN layer was produced using the methods provided by the present disclosure.

Figure 15:
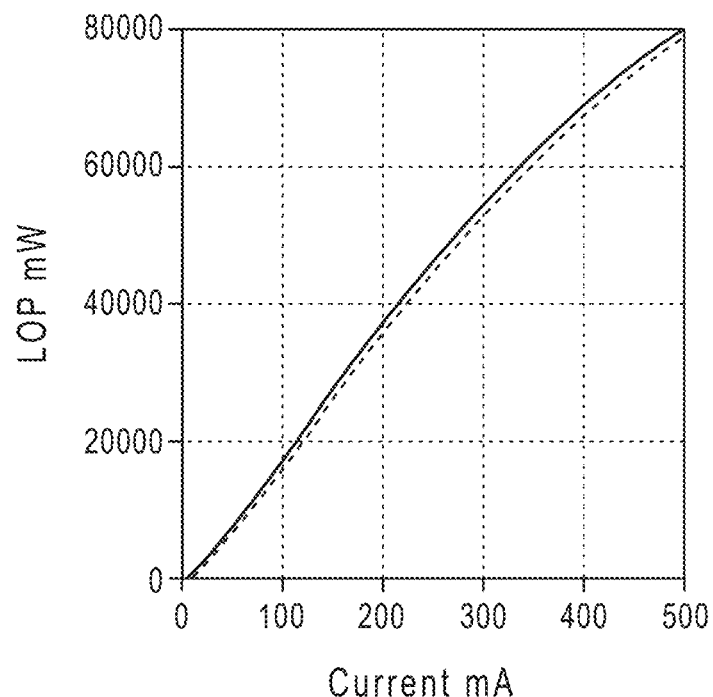
FIG. 15 shows the LOP as a function of input current for a multiple quantum well (MQW) LED with and without an overlying n-p GaN tunnel junction including exposure to a $NH_3$:$H_2$ environment. The devices are similar to those referred to in FIGS. 13A and 13B.

FIG. 15 shows the LOP with current for LED devices processed according to process conditions B (FIG. 17, Table 4), and corresponding to the devices having the IV curves shown in FIGS. 13A and 13B. The results shown in FIG. 15 demonstrate that tunnel junctions fabricated using process conditions B and fabricated according to methods provided by the present disclosure exhibited a slightly higher LOP at the same current compared to an LED n-GaN layers grown over an ITO film.

Figure 16A:
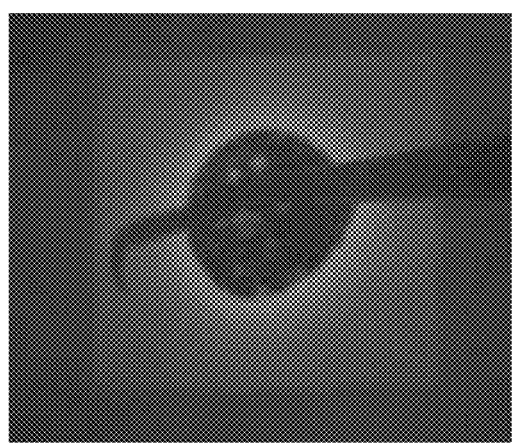
FIGS. 16A and 16B shows the electroluminescent images of the overgrown MQW LEDs of FIGS. 13A and 13B, respectively.
Figure 16B:
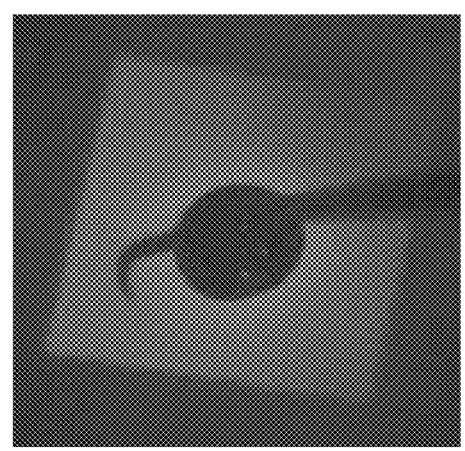

FIGS. 16A and 16B show photographs of electroluminescence images of an LED with an overlying n/p-GaN tunnel junction fabricated according to methods provided by the present disclosure and using process conditions B, and without an overlying n/p-GaN tunnel junction, respectively. The images shown in FIGS. 16A and 16B were obtained for the devices shown in FIGS. 13A and 13B, respectively. The quality of the electroluminescence was comparable demonstrating that the n/p-tunnel junction did not degrade the performance of the LED and thereby confirming that the p-GaN layer is activated.

Finally, it should be noted that there are alternative ways of implementing the embodiments disclosed herein. Accordingly, the present embodiments are to be considered as illustrative and not restrictive. Furthermore, the claims are not to be limited to the details given herein, and are entitled to their full scope and equivalents thereof.

What is claimed is:

1. A method of fabricating a semiconductor structure comprising a buried activated p-(Al,In)GaN layer, comprising:
   (a) exposing a magnesium-doped p-(Al,In)GaN layer to a gaseous mixture comprising H$_2$, NH$_3$, or a combination thereof, wherein the gaseous mixture has a partial pressure of H$_2$ less than 760 Torr, to provide an exposed magnesium-doped p-(Al,In)GaN layer; and
   (b) growing an n-(Al,In)GaN layer on the exposed magnesium-doped p-(Al,In)GaN layer by RPCVD in an environment wherein the partial pressure of H$_2$ is greater than the partial pressure of N$_2$,
   to provide a semiconductor structure comprising a buried activated p-(Al,In)GaN layer.

2. The method of claim 1, wherein the method consists of steps (a) and (b).

3. The method of claim 1, wherein in step (a) the gaseous mixture does not comprise N$_2$.

4. The method of claim 1, wherein exposing comprises exposing the magnesium-doped p-(Al,In)GaN layer to a partial pressure of H$_2$ less than 300 Torr and to a temperature less than 900° C.

5. The method of claim 1, wherein the magnesium-doped p-(Al,In)GaN layer comprises a concentration of the magnesium dopant from 1E19 cm$^{-3}$ to 5E21 cm$^{-3}$.

6. The method of claim 1, wherein exposing the magnesium-doped p-(Al,In)GaN layer comprises exposing for less than 5 minutes.

7. The method of claim 1, wherein in step (a) the partial pressure of H$_2$ is from 1 Torr to 300 Torr.

8. The method of claim 1, wherein in step (b) the partial pressure of H$_2$ is from 0.1 Torr to 300 Torr.

9. The method of claim 1, wherein in step (a) exposing the magnesium-doped p-(Al,In)GaN layer comprises exposing to a N$_2$ plasma.

10. The method of claim 1, wherein the magnesium-doped p-(Al,In)GaN layer is a passivated p-(Al,In)GaN layer.

11. The method of claim 1, wherein the magnesium-doped p-(Al,In)GaN layer is an at least partially activated p-(Al,In)GaN layer.

12. The method of claim 1, wherein (b) growing the n-(Al,In)GaN layer consists of growing an n-(Al,In)GaN layer on the exposed magnesium-doped p-(Al,In)GaN layer by RPCVD in an environment wherein the partial pressure of H$_2$ is greater than the partial pressure of N$_2$.

13. The method of claim 1, wherein step (b) comprises:
(b1) growing a first n-(Al,In)GaN layer on the exposed magnesium-doped p-(Al,In)GaN layer by RPCVD in an environment wherein the partial pressure of N$_2$ is greater than the partial pressure of H$_2$; and
(b2) growing a second n-(Al,In)GaN layer on the first n-(Al,In)GaN layer by RPCVD in an environment wherein the partial pressure of H$_2$ is greater than the partial pressure of N$_2$.

14. The method of claim 13, wherein the method consists of steps (a), (b1), and (b2).

15. The method of claim 13, wherein the first n-(Al,In)GaN layer has a thickness less than 30 nm.

16. The method of claim 13, wherein the magnesium-doped p-(Al,In)GaN layer comprises a concentration of the magnesium dopant from 1E19 cm$^{-3}$ to 5E21 cm$^{-3}$.

17. The method of claim 13, wherein in step (b1) the partial pressure of N$_2$ is from 0.1 Torr to 300 Torr.

18. The method of claim 13, wherein in step (b1) the partial pressure of N$_2$ is from 0.1 Torr to 10 Torr and the temperature is from 500° C. to 1,050° C.

19. The method of claim 13, wherein in step (b2) growing the second n-(Al,In)GaN layer comprises growing in the presence of H$_2$ and NH$_3$ at a partial pressure of H$_2$ from 0.1 Torr to 10 Torr and a temperature from 500° C. to 1,050° C.

20. The method of claim 1, further comprising, after (b) growing the n-(Al,In)GaN layer; (c) growing one or more semiconductor layers overlying the n-(Al,In)GaN layer.

21. The method of claim 20, wherein (c) growing the one or more semiconductor layers comprises growing the one or more semiconductor layers in the presence of H$_2$, NH$_3$, or a combination thereof, at a temperature less than 1,050° C.

22. The method of claim 1, wherein the buried activated p-(Al,In)GaN layer has a minimum lateral dimension greater than 100 μm.

23. The method of claim 1, wherein a n/p-(Al,In)GaN tunnel junction incorporating the buried activated p-(Al,In)GaN layer is characterized by a voltage drop across the n/p-(Al,In)GaN tunnel junction of less than 0.3 V at 10 A/cm$^2$.

24. A semiconductor device comprising a semiconductor structure fabricated by the method of claim 1.

25. The semiconductor device of claim 24, wherein the semiconductor device comprises a stacked optoelectronic structure, an LED, a laser diode, a photovoltaic device, an optoelectronic device, a solar cell junction, a transistor, or a power converter.

26. An n/p-(Al,In)GaN tunnel junction comprising a semiconductor structure fabricated by the method of claim 1.

27. A semiconductor device comprising the tunnel junction of claim 26.

28. The semiconductor device of claim 27, wherein the semiconductor device comprises a stacked optoelectronic structure.

29. The semiconductor device of claim 28, wherein the stacked optoelectronic structure comprises a stacked LED structure, a stacked laser diode structure, a multijunction solar cell, a stacked transistor, or a stacked power converter.

* * * * *